United States Patent [19]
Wang et al.

[11] Patent Number: 5,859,964
[45] Date of Patent: Jan. 12, 1999

[54] SYSTEM AND METHOD FOR PERFORMING REAL TIME DATA ACQUISITION, PROCESS MODELING AND FAULT DETECTION OF WAFER FABRICATION PROCESSES

[75] Inventors: Qingsu Wang; Gerald Barnett; R. Michael Greig; Yi Cheng, all of Travis, Tex.

[73] Assignee: Advanced Micro Devices, Inc.

[21] Appl. No.: 736,919

[22] Filed: Oct. 25, 1996

[51] Int. Cl.⁶ .................................................. G06F 11/00
[52] U.S. Cl. .................................................. 395/185.01
[58] Field of Search ......................... 395/21, 23, 183.01, 395/183.02, 183.09, 185.01, 185.02

[56] References Cited

U.S. PATENT DOCUMENTS

| 5,600,758 | 2/1997 | Broese et al. | 395/21 |
| 5,659,667 | 8/1997 | Buescher et al. | 395/23 |

*Primary Examiner*—Albert Decady
*Attorney, Agent, or Firm*—Kevin L. Daffer; Conley, Rose & Tayon

[57] ABSTRACT

A system and method for detecting faults in wafer fabrication process tools by acquiring real-time process parameter signal data samples used to model the process performed by the process tool. The system includes a computer system including a DAQ device, which acquires the data samples, and a fault detector program which employs a process model program to analyze the data samples for the purpose of detecting faults. The model uses data samples in a reference database acquired from previous known good runs of the process tool. The fault detector notifies a process tool operator of any faults which occur thus potentially avoiding wafer scrap and potentially improving mean time between failures. The fault detector also receives notification of the occurrence of process events from the process tool, such as the start or end of processing a wafer, which the fault detector uses to start and stop the data acquisition, respectively. The fault detector also receives notification of the occurrence of a new process recipe and uses the recipe information to select the appropriate model for modeling the data samples. The fault detector employs a standard data exchange interface, such as DDE, between the fault detector and the model, thus facilitating modular selection of models best suited to the particular fabrication process being modeled. Embodiments are contemplated which use a UPM model, a PCA model, or a neural network model.

36 Claims, 17 Drawing Sheets

| sample | Helium | CHF3 | CF4 | Argon | HePres | REFPres | ProcPres | EndPnt | UET | LET | RFRefl | RFFwd |
|---|---|---|---|---|---|---|---|---|---|---|---|---|
| 1 | 0 | 0.01 | 0.65 | 0.02 | 0.04 | 0.03 | 0.07 | -0.13 | 4.11 | -1.58 | 0.01 | 0 |
| 2 | 0 | 0.01 | 0.97 | 0.39 | 0.04 | 0.02 | 0.08 | -0.13 | 4.14 | -1.56 | 0.01 | 0 |
| 3 | 0.01 | 0.9 | 1 | 1.03 | 0.03 | 0 | 0.38 | -0.13 | 4.14 | -1.54 | 0 | 0.01 |
| 4 | 0 | 1.02 | 1 | 1.11 | 0.04 | 0.13 | 0.47 | -0.14 | 4.15 | -1.58 | 0.01 | 0 |
| 5 | 0 | 1 | 1 | 1.14 | 0.06 | 0.12 | 0.47 | -0.13 | 4.14 | -1.56 | 0 | 0.01 |
| 6 | -0.01 | 1 | 1 | 1.14 | 0.05 | 0.13 | 0.47 | -0.14 | 4.15 | -1.56 | 0.01 | 0 |
| 7 | 0 | 1 | 1 | 1.16 | 0.06 | 0.14 | 0.47 | -0.13 | 4.13 | -1.55 | 0.01 | 0.01 |
| 8 | 0.01 | 1.01 | 1.01 | 1.15 | 0.05 | 0.12 | 0.49 | -0.13 | 4.16 | -1.56 | 0.01 | 0 |
| 9 | 0 | 1 | 1.02 | 1.14 | 0.06 | 0.11 | 0.5 | -0.13 | 4.16 | -1.56 | 0.01 | 0 |
| 10 | 0.01 | 1.01 | 1.01 | 1.15 | 0.05 | 0.12 | 0.5 | -0.13 | 4.15 | -1.57 | 0.01 | 0 |
| 11 | 0 | 1.01 | 1.01 | 1.15 | 0.05 | 0.14 | 0.5 | -0.12 | 4.15 | -1.56 | 0.01 | 0 |
| 12 | 0 | 1 | 1 | 1.18 | 0.06 | 0.11 | 0.51 | -0.14 | 4.13 | -1.56 | 0 | 0.01 |
| 13 | 0.01 | 1.01 | 1.01 | 1.19 | 0.06 | 0.11 | 0.5 | -0.14 | 4.16 | -1.55 | 0.02 | 0.01 |
| 14 | 0 | 1 | 1.02 | 1.18 | 0.06 | 0.12 | 0.5 | -0.14 | 4.14 | -1.54 | 0.01 | 0 |
| 15 | 0 | 1.01 | 1.01 | 1.16 | 0.64 | 0.12 | 0.5 | -0.13 | 4.15 | -1.55 | 0.01 | 0 |
| 16 | 0.01 | 1.01 | 1.02 | 1.16 | 1.23 | 0.13 | 0.49 | -0.13 | 4.13 | -1.53 | 0.01 | 0 |
| 17 | 0 | 1 | 1 | 1.14 | 1.62 | 0.13 | 0.51 | -0.14 | 4.14 | -1.56 | 0.02 | 0.01 |
| 18 | 0.01 | 1.01 | 1.01 | 1.15 | 1.7 | 0.13 | 0.5 | -0.14 | 4.13 | -1.55 | 0.01 | 0 |
| 19 | 0.01 | 1 | 1 | 1.22 | 1.57 | 0.13 | 0.51 | -0.14 | 4.13 | -1.55 | 0.01 | 0 |
| 20 | 0 | 1.01 | 1.02 | 1.24 | 1.38 | 0.13 | 0.51 | -0.14 | 4.13 | -1.55 | 0.01 | 0 |
| 21 | 0 | 1.01 | 1.02 | 1.2 | 1.22 | 0.12 | 0.49 | -0.12 | 4.12 | -1.56 | 0 | 0 |
| 22 | 0.01 | 1 | 1.01 | 1.17 | 1.11 | 0.13 | 0.51 | -0.12 | 4.13 | -1.55 | 0 | 0 |
| 23 | 0 | 1 | 1 | 1.15 | 1.05 | 0.14 | 0.5 | -0.13 | 4.11 | -1.55 | 0.01 | -0.01 |
| 24 | 0.01 | 1 | 1 | 1.14 | 1.06 | 0.13 | 0.51 | -0.13 | 4.13 | -1.55 | 0 | 0 |
| 25 | 0.01 | 1 | 0.99 | 1.14 | 1.1 | 0.12 | 0.49 | -0.13 | 4.14 | -1.57 | 0 | -0.01 |
| 26 | 0 | 1 | 1.02 | 1.13 | 1.15 | 0.13 | 0.51 | -0.13 | 4.13 | -1.55 | 0.01 | 0 |
| 27 | 0.01 | 1 | 1 | 1.14 | 1.22 | 0.14 | 0.49 | -0.13 | 4.13 | -1.57 | 0.01 | -0.01 |
| 28 | 0.01 | 1.01 | 1.01 | 1.12 | 1.25 | 0.12 | 0.51 | -0.13 | 4.12 | -1.56 | 0.01 | 0 |
| 29 | 0 | 1.01 | 1.01 | 1.14 | 1.25 | 0.12 | 0.5 | -0.13 | 4.13 | -1.56 | 0.01 | 0 |
| 30 | 0 | 1.01 | 1.01 | 1.13 | 1.24 | 0.13 | 0.5 | -0.13 | 4.12 | -1.56 | 0.01 | 0 |
| 31 | 0.01 | 1.01 | 1.01 | 1.15 | 1.21 | 0.13 | 0.51 | 2.96 | 4.13 | -1.57 | 2.23 | 2.31 |
| 32 | 0 | 1 | 1.01 | 1.13 | 1.2 | 0.13 | 0.5 | 4.25 | 4.13 | -1.54 | 2.23 | 2.31 |
| 33 | 0.01 | 1.01 | 1.01 | 1.15 | 1.2 | 0.13 | 0.5 | 4.57 | 4.12 | -1.55 | 2.23 | 2.32 | k$^{th}$ sampling time step
sample range

FIG. 8

SYSTEM AND METHOD FOR PERFORMING REAL TIME DATA ACQUISITION, PROCESS MODELING AND FAULT DETECTION OF WAFER FABRICATION PROCESSES

BACKGROUND OF THE INVENTION

1. Field of the Invention

This invention relates to semiconductor wafer fabrication and more particularly to the acquiring of data during a wafer fabrication process performed by wafer fabrication equipment in real-time and detecting fault conditions in the equipment and/or process by modeling the acquired data.

2. Description of the Relevant Art

In a typical semiconductor manufacturing process, semiconductor wafers are moved through a wafer fabrication assembly line. At each location in the assembly line, processing equipment, or processing tools, perform processing operations to modify the wafers such as by adding layers to the wafers of various materials, and modifying the layers to form a completed product. Examples of processing operations are metal deposition, oxide growth, and source/drain implant.

As the wafers are moved through the assembly line, periodic quality checks are performed on the wafers. The quality checks typically include measuring widths of microscopic lines and film thicknesses on the wafer to detect aberrations. Unfortunately, the measurements can often be made only after the material has undergone processing operations subsequent to those which introduce aberrations. Consequently, the checks can be used to prevent adding more cost to an unusable lot of wafers, but not to save the processed lot from being scrapped. A lot is defined as a set of wafers, typically contained within a wafer boat or cassette.

The quality check measurements add cost in the form of process time and equipment expense. Furthermore, an interval of time typically occurs between introduction of the aberration and detection of the aberration. During the interval, more unusable lots of wafers are processed. This problem is widely known and understood in the semiconductor industry, and various attempts have been and are being made to apply what is called "advanced process control" (APC) to address the problem. In particular, "Fault Detection and Classification" (FDC) systems are one type of APC system which attempts to address the problem.

An FDC system directly monitors process equipment parameters in order to detect conditions which may cause aberrations as they occur. Examples of process parameters are temperature, pressure, power, and flow rates of process materials. A process parameter may be defined as a stimuli upon a processing tool necessary to effectuate a processing outcome such as metal deposition, oxide growth, source/drain implant.

FDC systems collect process parameter data and analyze the data for an abnormality, or fault, during the operation of the process equipment. An example of a process fault is a significant drop in temperature from the temperature required to perform the given process operation, e.g., thermal oxidation. Another example of a fault is a spike in a flow rate of a process material, such as helium. If a fault is detected, the system may have various means of reacting, such as notifying an equipment operator or halting the process equipment. An FDC system typically collects data in one of two methods.

The first data collection method is to receive process parameter data which the process equipment provides through a communications port in the process equipment. Most processing equipment includes built in sensors to gather process parameter data for at least some of the process parameters which the equipment uses. Examples of common process equipment communications ports are RS-232 ports and parallel ports. The data, which may also include state information such as a currently running recipe or recipe step, and event information such as notification of a new wafer or new lot of wafers, is commonly communicated via the SECS-II (Semiconductor Equipment Communications Standard II) or Generic Equipment Model (GEM) protocols on the equipment communications port. A recipe may be defined as a set of process "ingredients", i.e., process parameters, "prepared" according to a set of process steps.

This first method of collecting data has some disadvantages. First, a monitoring system which uses sensor data provided by the process equipment is dependent on the equipment control system and therefore does not perform an independent audit. Second, the data collection rate may be inadequate due to the data transfer rate limitations of the communications port and/or the fact that the processor typically included in process equipment must perform other tasks in addition to collecting and providing process parameter data. For example, a Rapid Thermal Process (RTP) may require high data sampling rates for the temperature signals which are beyond those which may be provided via the communications port. Third, the process equipment may not be able to provide process parameter data on a linear time scale, i.e., at a constant sampling rate, thus complicating analysis of the received data.

A second data collection method employs a data acquisition (DAQ) device. According to this second method, sensors, or transducers, are placed inside or outside the processing equipment which measure the process parameters and convert the measurements into electrical signals, typically voltage signals, which are provided to the DAQ device.

An advantage of the second data collection method is that the DAQ device is capable of acquiring process parameter signal data samples at a constant and relatively high sample rate. Furthermore, the DAQ device is capable of acquiring data samples independent of the process equipment itself. Furthermore, the DAQ device is capable of monitoring signals which may not monitored by the equipment itself, such as room temperature, barometric pressure, etc., or process parameter signals which the equipment was not designed to measure. A disadvantage of the second data collection method is the lack of equipment state or event information, such as the current recipe, process step, wafer number, lot number, etc. since there is no connection to the processing equipment processor. Thus, the equipment state or event information can only be inferred.

Thus, an FDC system which incorporates the advantages of both the data collection methods, i.e., a system which both collects state or event information from the process equipment and acquires real-time process parameter data independent from the intelligence, i.e., processor, of the process equipment is desired.

Once the process parameter data is collected, the data may be analyzed by one of several methods. One data analysis method is to employ a model which predicts expected values of the collected data and provides an indication of the relative conformance of a wafer fabrication process being monitored to a desired process. Different modeling methods may be superior for different wafer fabrication processes or process operations. Therefore, a system which is modular with respect to modeling methods, i.e., allows different process models to be employed which best model the particular process being performed, is desired.

SUMMARY OF THE INVENTION

The problems outlined above are in large part solved by the fault detection system of the present invention. In one embodiment, the system includes a computer system including a DAQ device, which acquires data samples of various wafer fabrication process parameter signals while a process tool fabricates wafers. The system also includes a fault detector program which employs a process model program to analyze the data samples for the purpose of detecting fault conditions in the process tool or other aspects of the process. The process model uses data samples in a reference database acquired from previous runs of the process tool. The fault detector notifies a process tool operator of any faults which occur so that the operator or engineer can check the wafer quality. Thus, wafer scrap is potentially avoided, and mean time between failures is potentially improved.

The fault detector also receives notification of the occurrence of process events from the process tool, such as the start or end of processing a wafer, which the fault detector uses to start and stop the data acquisition, respectively. The fault detector also receives notification of the occurrence of a new process recipe and uses the recipe information to select the appropriate model for modeling the data samples. Thus, the fault detector advantageously uses the process event information in combination with the process parameter signal samples to perform improved fault detection.

Advantageously, the fault detector employs a standard data exchange interface between the fault detector and the model, thus facilitating modular selection of models best suited to the particular fabrication process being modeled. The invention contemplates embodiments using a Universal Process Model (UPM) model provided by Triant Technologies Inc., a Principle Component Analysis (PCA) model, or a neural network model. In one embodiment, the fault detector and model execute in the Windows® operating environment and the data exchange interface is the Microsoft dynamic data exchange (DDE) interface. The fault detector provides process parameter sample information to the model which the model uses to generate prediction error information. The fault detector uses the prediction error information to determine the likelihood of a fault occurrence. In one embodiment, the prediction error information is compared to a user-specifiable threshold value.

In one embodiment, a data viewer is provided to graphically display the data samples acquired by the data acquisition device and a report browser is provided to graphically view lot report information generated by the fault detector.

Broadly speaking, the system includes a means for receiving process event signals generated by a process tool, a data acquisition device configured to acquire a sample of process parameter signals during operation of the process tool, a model, selected from a plurality of possible models, configured to receive the sample and generate a prediction error in response to the sample, and a fault detector in communication with the model. The fault detector is configured to receive the sample from the data acquisition device and the process event signals from the process event signal receiving means, provide the sample to the model, receive the prediction error from the model, and use the prediction error to detect a fault in the process tool or other aspect of the process. The fault detector is configured to use the prediction errors to detect a fault independent of the plurality of possible models used to generate the prediction error.

In one embodiment, the process event signal receiving means includes a communications port. In an alternate embodiment, the process event signal receiving means includes a data acquisition device. The system further includes a display screen configured to display notification of the detected fault. The system further includes a reference database of representative samples which the model uses to generate the prediction error. The process event signals include at least one event from the group comprising a wafer start event, a wafer end event, a new lot event, a new recipe event, and an alarm.

BRIEF DESCRIPTION OF THE DRAWINGS

Other objects and advantages of the invention will become apparent upon reading the following detailed description and upon reference to the accompanying drawings in which:

FIG. 8 is a table illustrating samples in the reference database of FIG. 3 and an exemplary sample range used to perform time-dependent modeling;

Figure 1:
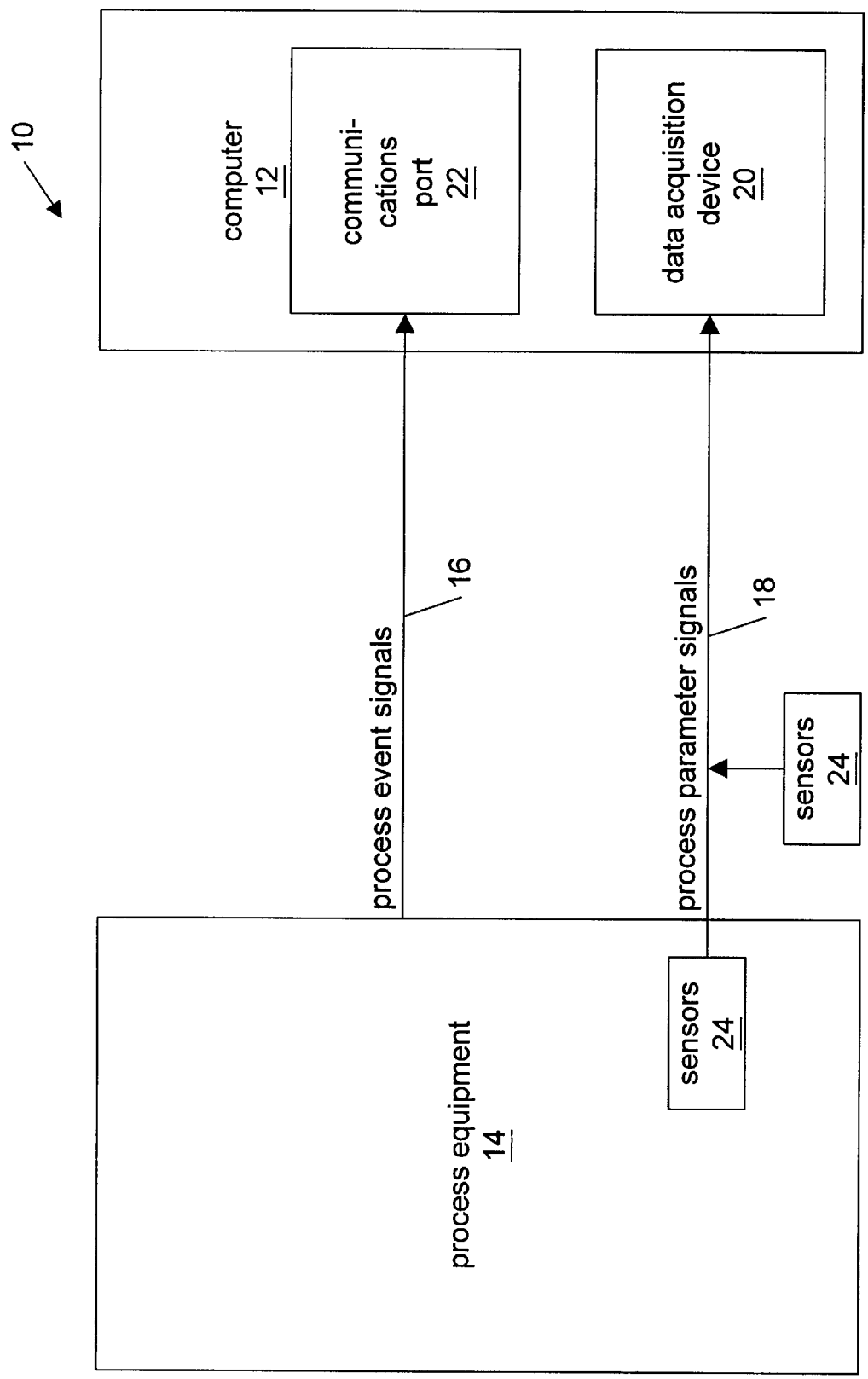
FIG. 1 is a block diagram of a system for detecting faults in wafer fabrication equipment according to the preferred embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Referring now to FIG. 1, a block diagram of a system 10 for detecting faults in wafer fabrication equipment according to the preferred embodiment of the present invention is shown. The system 10 comprises a computer 12 comprising a data acquisition device 20 and a communications port 22. The data acquisition device 20 is configured to receive process parameter signals 18 from sensors 24, or transducers. The sensors 24 are placed inside or outside wafer fabrication process equipment 14. The sensors 24 measure process parameters of a wafer fabrication process performed by the process equipment 14, and convert the measurements into electrical signals, typically voltage signals, which are provided to the data acquisition device 20. As defined herein, process parameters include, temperature, pressure, flow rate, power, etc., any of which as used to configure a wafer fabrication tool. The communications port 22 is configured to receive process event signals 16 generated by the process equipment 14.

The computer 12 is a computing device capable of controlling the data acquisition device 20 and communications port 22. The computer 12 will be described in more detail with reference to FIG. 2.

The process equipment 14 includes one or more process tools which perform processing operations such as metal deposition, oxide growth, and source/drain implant. Examples of the process equipment 14 are the LAM Research® Rainbow 4500 and Tegal® 1611 etching tools.

In one embodiment, the data acquisition device 20 is a National Instruments® AT-MIO-64E-3 DAQ board. Alternate embodiments are contemplated which employ other DAQ boards. In one embodiment, the sensors 24 measure the following process parameters from an etching tool: helium flow rate, CHF3 flow rate, CF4 flow rate, argon flow rate, helium pressure, reference pressure, process pressure, end point, upper electrode temperature, lower electrode temperature, reflected radio frequency (RF) power, and forward RF power as shown in FIG. 8. The sensors 24 convert the process parameter measurements into the electrical process parameter signals 18 which the data acquisition device 20 receives.

The process end point is a method used to tell when an etch is complete by watching the color of a gas glow in an etching chamber. As overlying material layers are etched away and the material layers below are exposed, the optical spectral content of the gas glow changes. Photo sensors referred to as "end point" sensors are typically employed to detect when the gas glow shift occurs so that the etch can be stopped. The time at which it is stopped is the end point time. Other endpoint methods include sensing changes in RF power and/or DC bias, which also change as layers are etched.

The data acquisition device 20 acquires the process parameter signals 18 on a periodic basis and stores the acquired signal values as data samples. In the present disclosure, "sample" or "data sample" is used to denote a data value, such as a voltage, acquired for a given process parameter, such as a helium gas flow rate, or to denote the set of data values acquired at a given instant in time for each of the process parameters, such as the set of values shown in a single line of FIG. 8. It is noted that the process parameter signals 18 are acquired by the data acquisition device 20 independent of the process equipment 14. In other words, the system 10 is advantageously not dependent upon the process equipment 14 to provide the desired process parameters.

The data acquisition device 20 is capable of acquiring the process parameter data samples at a constant rate of time. In one embodiment, the data acquisition device 20 is capable of acquiring more than 10 samples per second of each of the acquired process parameter signals 18. It is noted that the sampling constancy and rate are not dependent upon computing resources of the process equipment 14. In one embodiment, the data acquisition device 20 is configured to receive analog input signals and the process parameter signals 18 comprise analog signals.

In one embodiment, the communications port 22 is an RS-232 asynchronous serial port. The process equipment 14 also includes an RS-232 port which serially generates bits of data which are received by the communications port 22 of the computer 12. Process event signals 16 are communicated on the RS-232 interface between the process equipment 14 and the communications port 22. In one embodiment, the process equipment 14 communicates process event signals to the communications port 22 in conformance with the SECS-II protocol. In another embodiment, the process equipment 14 communicates process event signals to the communications port 22 in conformance with the GEM protocol. Process events communicated using the process event signals 16 include notification of a new process recipe, starting to process a new lot of wafers, starting to process a new wafer, ending processing a wafer, and an alarm. The process events are detected by the process equipment 14 and communicated to the communications port 22.

In one embodiment, the process event signals 16 are received by a second computer and forwarded to the computer 12.

Advantageously, the system 10 of the present invention collects both process event information generated by the process equipment 14 and process parameter data without reliance on the process equipment 14. The system 10 advantageously acquires the process parameter data at a constant and relatively high sampling rate.

Figure 1A:
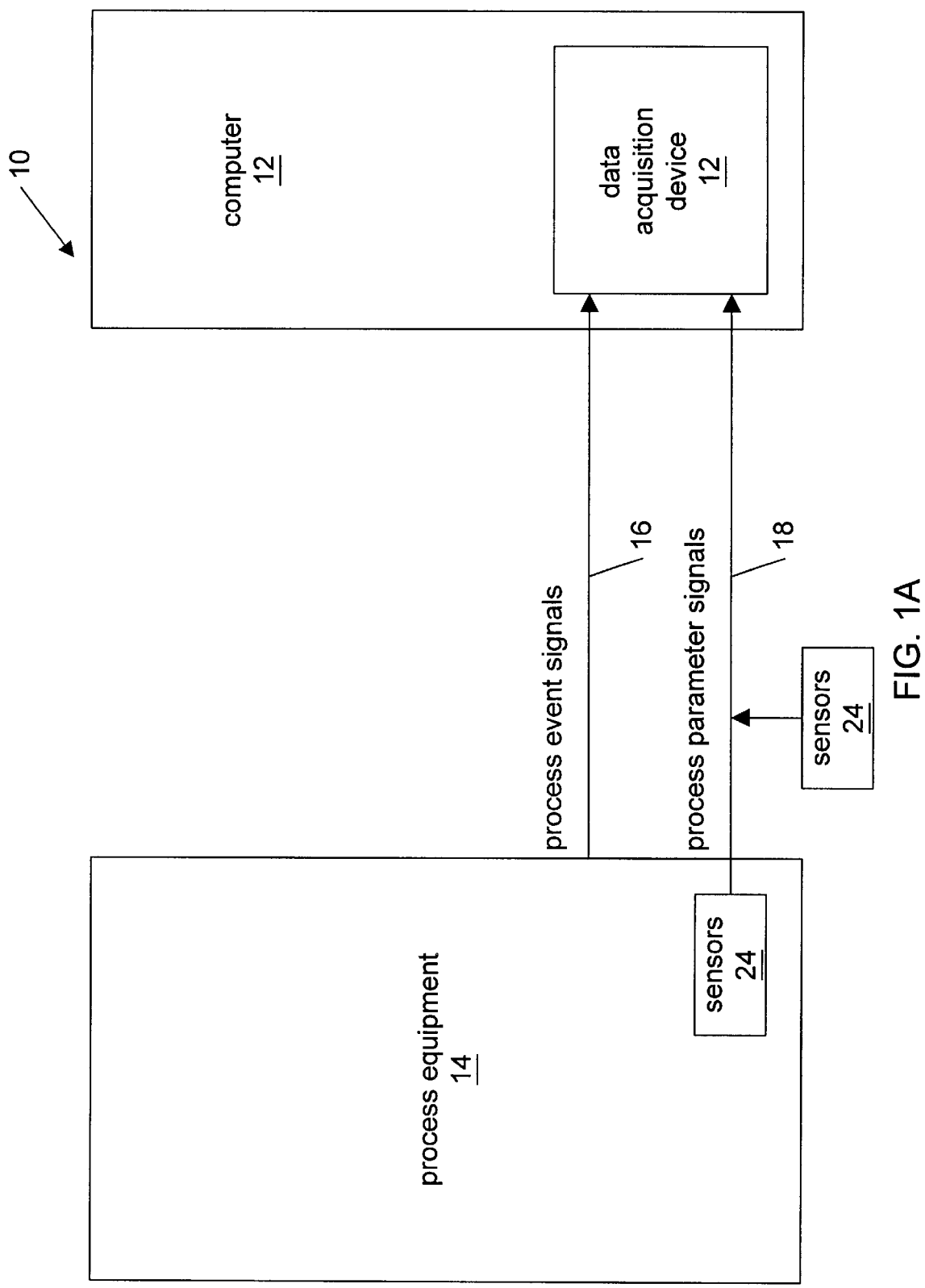
FIG. 1a is a block diagram of a system for detecting faults in wafer fabrication equipment according to an alternate embodiment of present invention.

Referring now to FIG. 1a, a block diagram of a system 10 for detecting faults in wafer fabrication equipment according to an alternate embodiment of present invention is shown. The system 10 is similar to the system 10 of FIG. 1 and corresponding elements are numbered identically. The system 10 is similar to the system 10 of FIG. 1, except that in the system 10 of FIG. 1a, the process equipment 14 generates the process event signals 16 as discrete output signals indicating process events rather than indicating process events via a communications port. The process event signals 16 are received by the data acquisition device 20, rather than by a communications port as in FIG. 1. One embodiment further contemplates the process event signals 16 being received by a second data acquisition device included in the computer 12, rather than by the data acquisition device 20.

In one embodiment, the data acquisition device 20 is configured to receive both analog input signals and digital input/output signals. In one embodiment, the process event signals 16 comprise digital signals and the process parameter signals 18 comprise analog signals.

Figure 2:
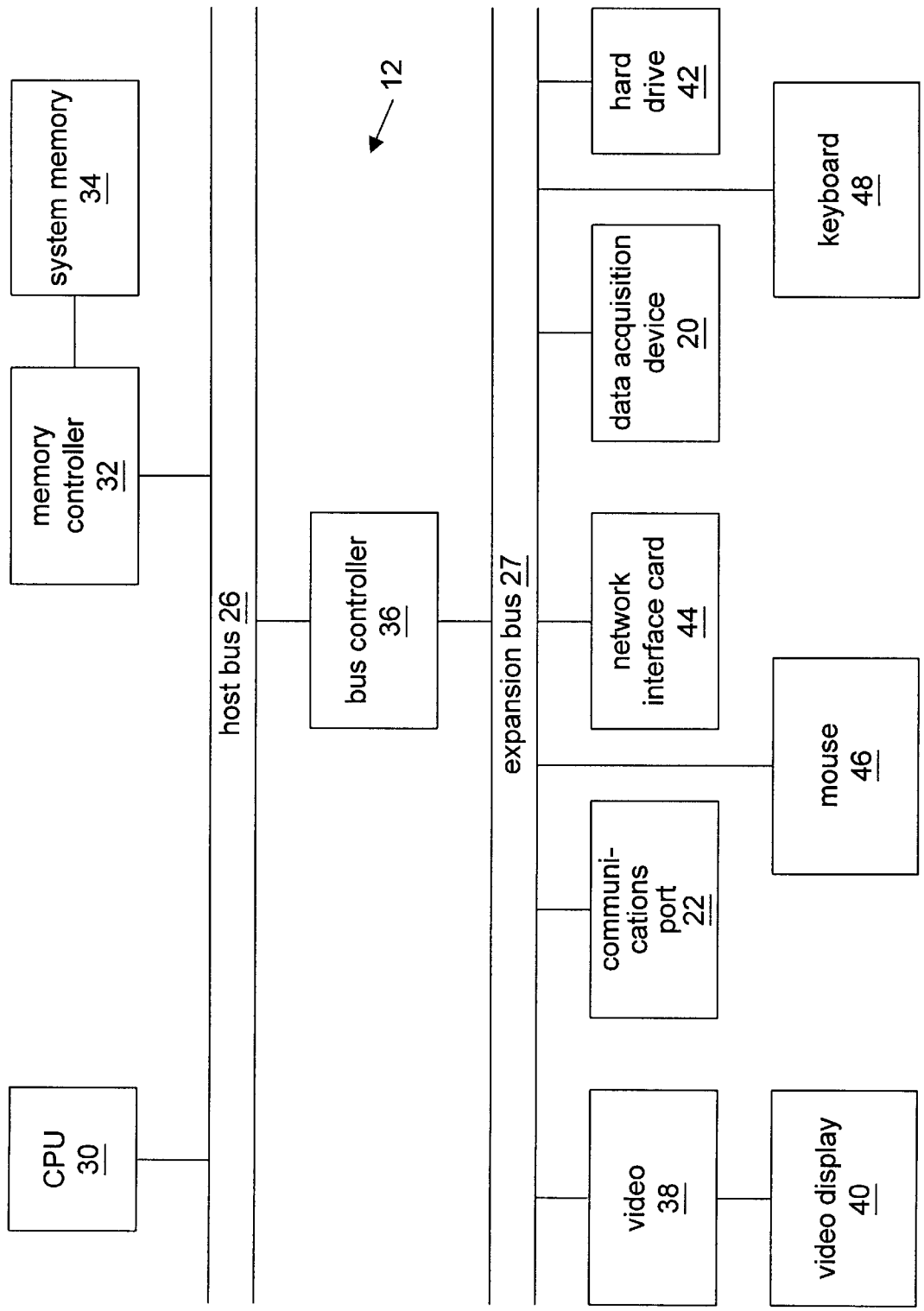
FIG. 2 is a block diagram of the computer system of FIG. 1.

Referring now to FIG. 2, a block diagram of the computer system of FIG. 1 is shown. The elements of a computer not necessary to understand the operation of the present invention have been omitted for simplicity. The computer 12 includes at least one central processing unit or CPU 30 which is coupled to a processor or host bus 26. The CPU 30 may be any of various types, including an x86® processor, a PowerPc® processor, a CPU from the Motorola® family of processors, a CPU from the SPARC® family of RISC processors, as well as others. System memory 34 is coupled to the host bus 26 by means of a memory controller 32.

Figure 3:
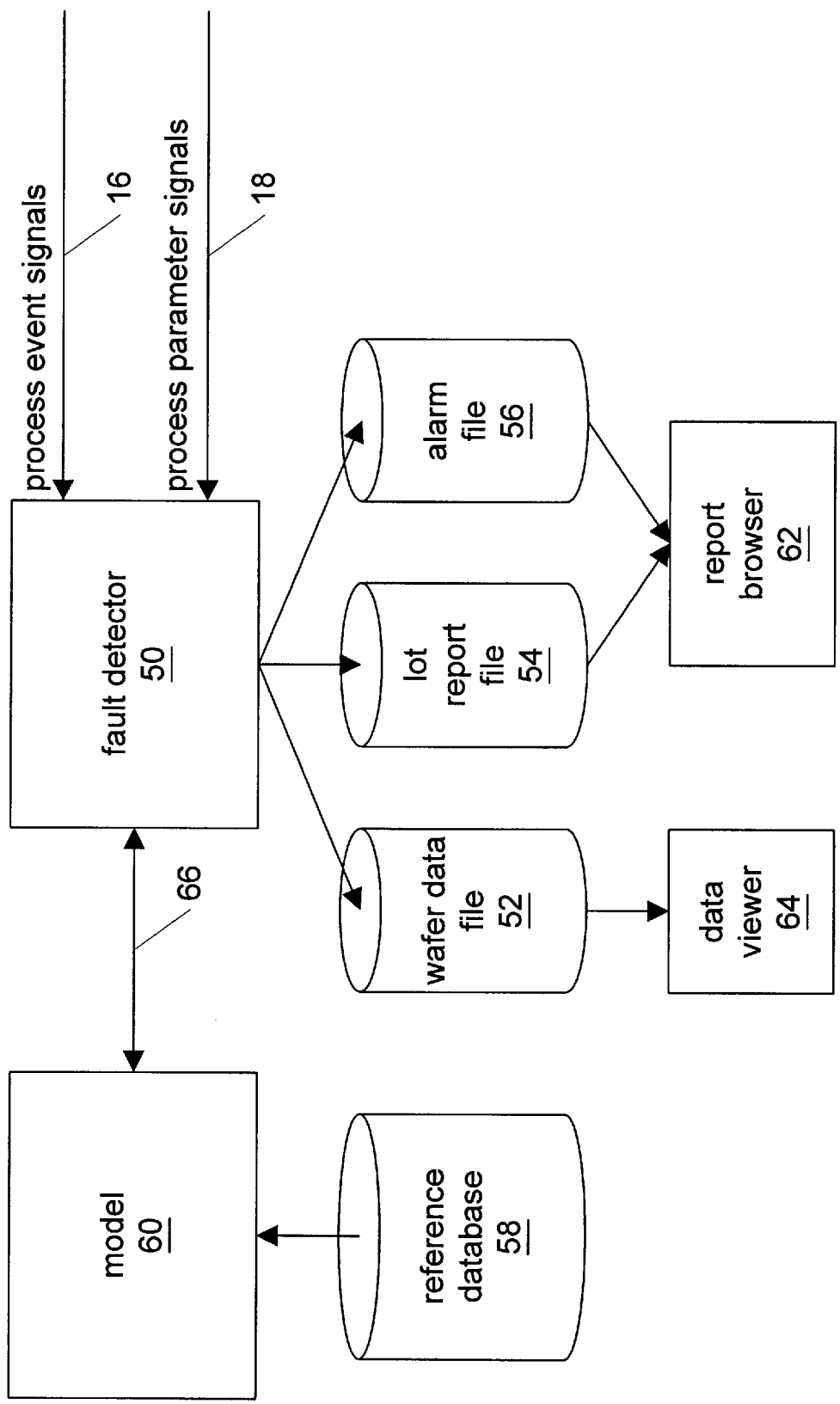
FIG. 3 is a block diagram illustrating a fault detector and model of the system of FIG. 1.

The system memory 34 stores the fault detector 50, model 60, data viewer 64, and report browser 62 of FIG. 3 for execution by the CPU 30. The system memory 34 also stores operating system software for operation of the computer system, as is well known to those skilled in the art. The fault detector 50, model 60, data viewer 64, and report browser 62 will be discussed in more detail with reference to FIG. 3.

The host bus 26 is coupled to an expansion or input/output bus 27 by means of a bus controller 36. The expansion bus 27 includes slots for various devices such as the data acquisition device 20 (of FIG. 1) and a network interface card 44. The computer 12 further comprises a video controller 38 coupled to a video display 40 in turn coupled to the expansion bus 27. The video display 40 is used to display fault detection messages, process event signal 16 information, and/or process parameter signal 18 information to an engineer or operator of the process equipment 14.

In one embodiment, the data acquisition device 20 is coupled to the computer 12 via a communications port such as a serial port, parallel port or General Purpose Interface Bus (GPIB) interface.

The system further includes a hard drive 42 for storing computer programs and data such as the fault detector 50, model 60, data viewer 64, report browser 62, wafer data files 52, lot report files 54, and alarm files 56 of FIG. 3. The system further includes the communications port 22 of FIG. 2 coupled to the expansion bus 27. The system further includes a mouse 46 and keyboard 48 coupled to the expansion bus 27 for receiving user input.

Referring now to FIG. 3, a block diagram illustrating a fault detector 50 and model 60 of the system of FIG. 1 is shown. Preferably, the fault detector 50 and model 60 comprise computer programs including instructions which execute on the CPU 30 of FIG. 2. However, an embodiment is contemplated in which the fault detector 50 and model 60 comprise digital hardware for performing the functions described infra.

Preferably, the fault detector 50 is a data flow program developed using and executed within the National Instruments LabVIEW® graphical programming environment. LabVIEW includes system software, in particular device drivers and libraries for controlling the communications port 22 and data acquisition device 20. The LabVIEW system software provides an interface between the fault detector 50 and the communications port 22 and/or data acquisition device 20. The LabVIEW system software provides a means for the fault detector 50 to, inter alia, receive notification of process events generated by the process equipment 14 on the process event signals 16, and receive process parameter signals 18 sample data from the data acquisition device 20.

Figure 13:
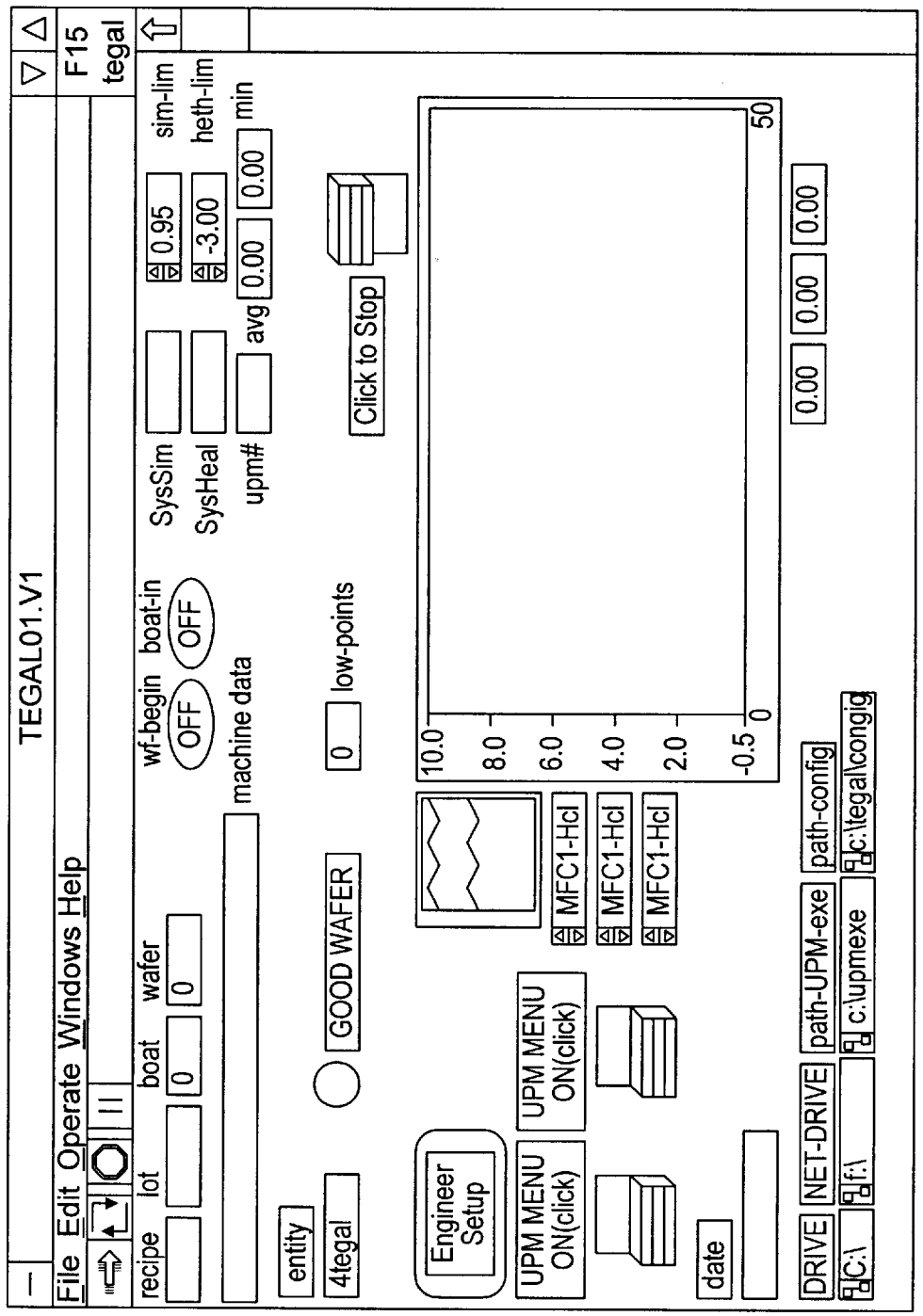
FIG. 13 is a screen shot of the user interface portion of the fault detector of FIG. 3.

The fault detector 50 performs various functions such as configuring, controlling and receiving data from the data acquisition device 20, servicing process event signals from the communications port 22 or data acquisition device 20, providing data sample information to the model 60, receiving prediction errors from the model 60, analyzing the prediction errors to detect process faults, providing a user interface to the engineer or process tool operator, and generating and managing wafer data files 52, lot report files 54, and alarm files 56. FIG. 13 shows a screen shot of the user interface of one embodiment of the fault detector 50.

The wafer data file 52 includes the process parameter signal 18 sample data acquired by the data acquisition device 20 and received by the fault detector 50. Preferably, the wafer data file 52 is organized as a set of tuples, or records, each tuple including a data sample value for each of the process parameter signals 18 sampled. In one embodiment the tuple includes an ASCII string of comma separated values. Each tuple further includes the time at which the data sample was obtained. Additionally, each tuple includes the process recipe step which was being performed when the data sample was acquired. Further, each tuple preferably includes prediction errors generated by the model 60 for the given sample. Preferably a wafer data file 52 is created for each wafer processed by the process equipment 14.

Figure 10:
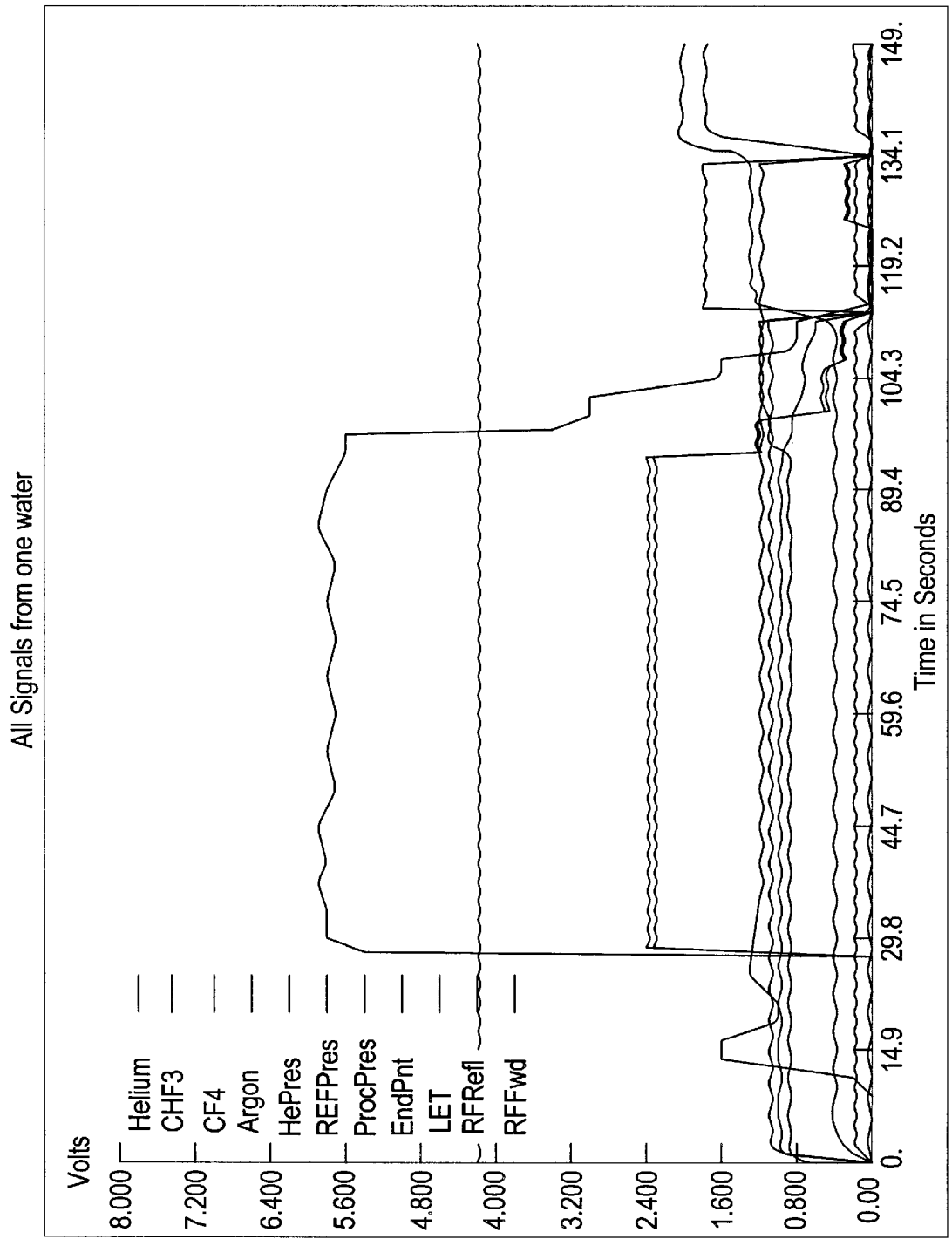
FIGS. 10–12 are exemplary graphs displayed by the data viewer of FIG. 3.
Figure 11:
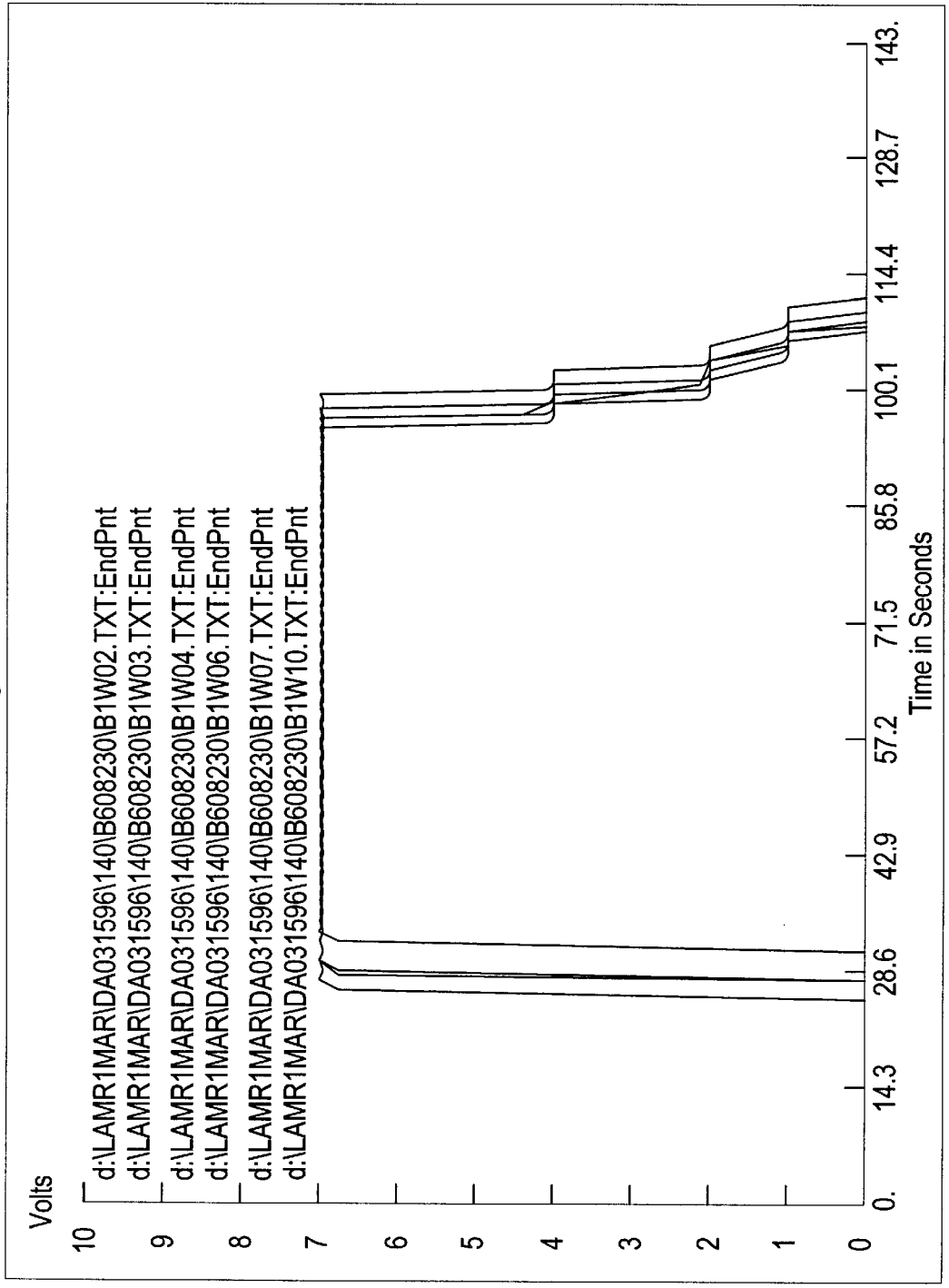
Figure 12:
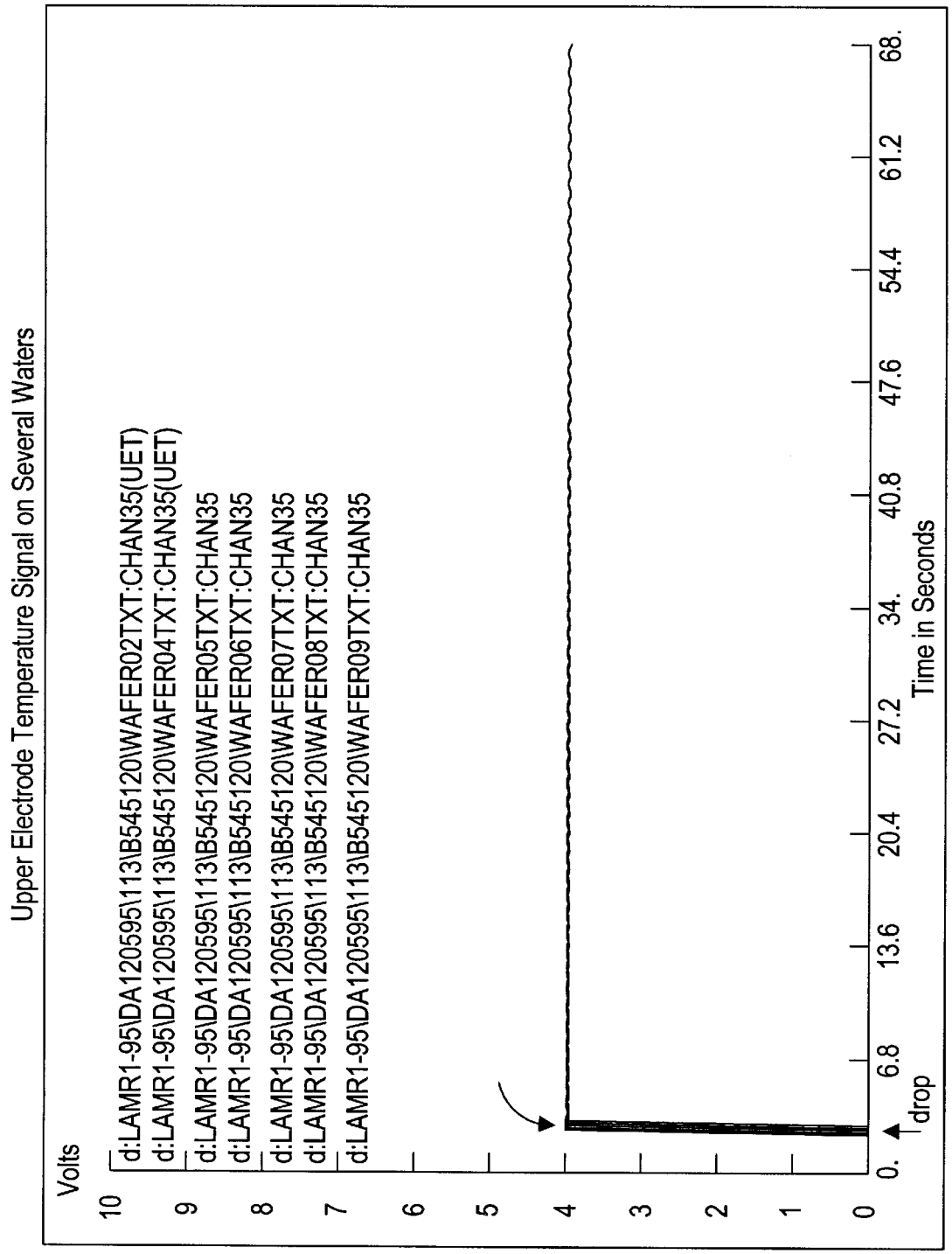

The information in the wafer data file 52 may be graphically displayed using a data viewer 64 program. The data viewer 64 reads one or more wafer data files 52 and displays the data in a graphical format. The data may be displayed according to a variety of options. For example, the sample data associated with all the process parameter signals for a given wafer may be displayed, as shown in FIG. 10. In addition, the sample data associated with a given process parameter for all the wafers in a given lot may be displayed, as shown in FIG. 11. Furthermore, the sample data associated with a given process parameter for selected wafers in a given lot may be displayed, as shown in FIG. 12.

The lot report file 54 includes a lot number, a date on which the processing of the lot began, a recipe number associated with the lot, and a synopsis of the prediction errors for each wafer in the lot. Preferably, the lot report file 54 is organized as a set of tuples each including a wafer number and boat or cassette number, prediction error information, and the time when the wafer is finished being processed, i.e., the wafer end time. In one embodiment, the tuple includes an ASCII string of white space separated values. In one embodiment, the prediction error information includes an average prediction error value, a worst case prediction value, and a number of times for the given wafer in which the prediction error exceeded a specified threshold value. Preferably, a lot report file 54 is created for each lot of wafers.

The alarm file 56 includes information regarding alarms generated by the process equipment 14. Preferably, the alarm file 56 is organized as a set of tuples each including a recipe number, a lot number, and wafer number associated with the wafer being processed when the alarm occurred as well as the time when the alarm occurred and the alarm type.

Figure 9:
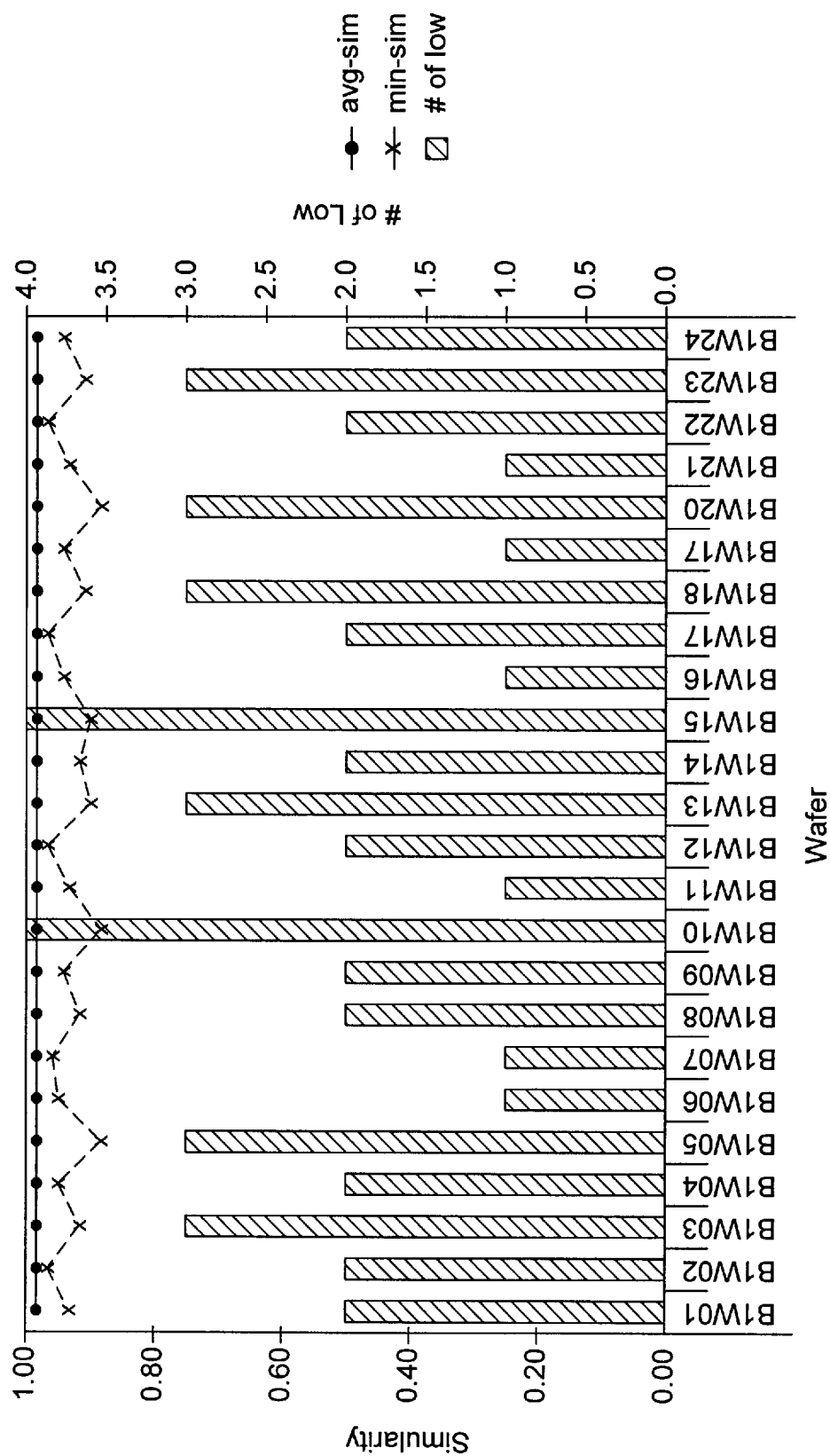
FIG. 9 is an exemplary graph displayed by the report browser of FIG. 3.

The information in the lot report files 54 and alarm file 56 may be graphically displayed using a report browser 62 program. The report browser 62 reads the lot report file 54 and displays the data in a graphical format as shown in FIG. 9. In the example of FIG. 9, the prediction error is represented as a "similarity" between a given sample and a prediction of what the sample should be. The display includes a graph of the average similarity of all the samples acquired for each wafer in the lot, the minimum similarity for each wafer, and a bar graph of the number of times in which the similarity of a given sample for a given wafer was lower than a specified threshold.

The model 60 receives sample information from the fault detector 50 and generates a prediction error in response to the sample information. Preferably, the sample information includes a sample of process parameter signals 18 and a sequence identifier associated with the sample. The fault detector 50 receives the prediction error from the model 60 and uses the prediction error to detect fault conditions in the process equipment 14. The manner in which the model 60 generates the prediction error is dependent upon the type of the model 60.

Preferably, the model 60 uses a reference database 58 to perform the modeling function. Preferably, the reference database 58 includes data samples acquired during prior operation of the process equipment 14. The model 60 includes a different model, i.e., set of samples, for each recipe which is to be made by the process equipment 14.

Figure 3A:
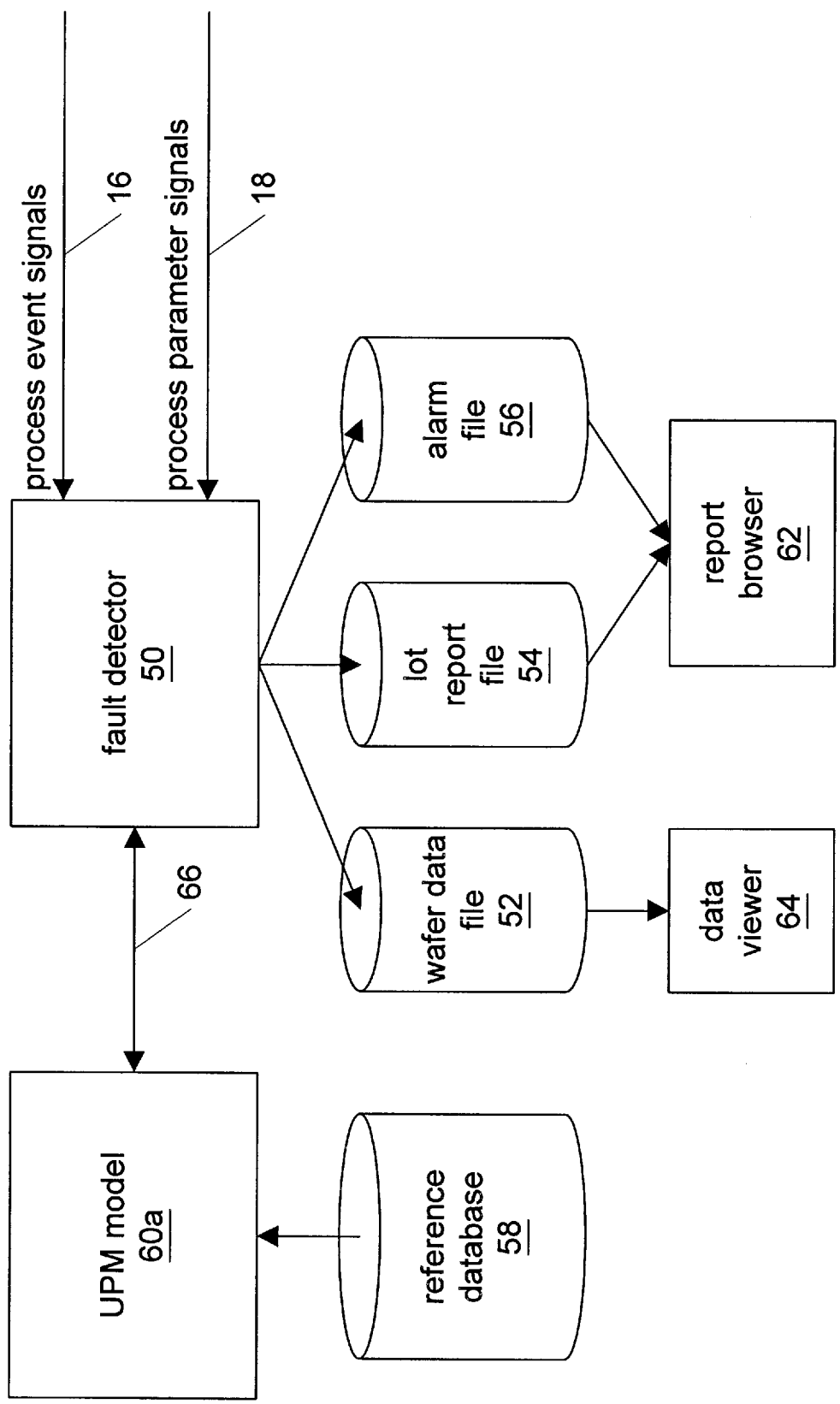
FIGS. 3a–3c are block diagrams illustrating different embodiments of FIG. 3.
Figure 3B:
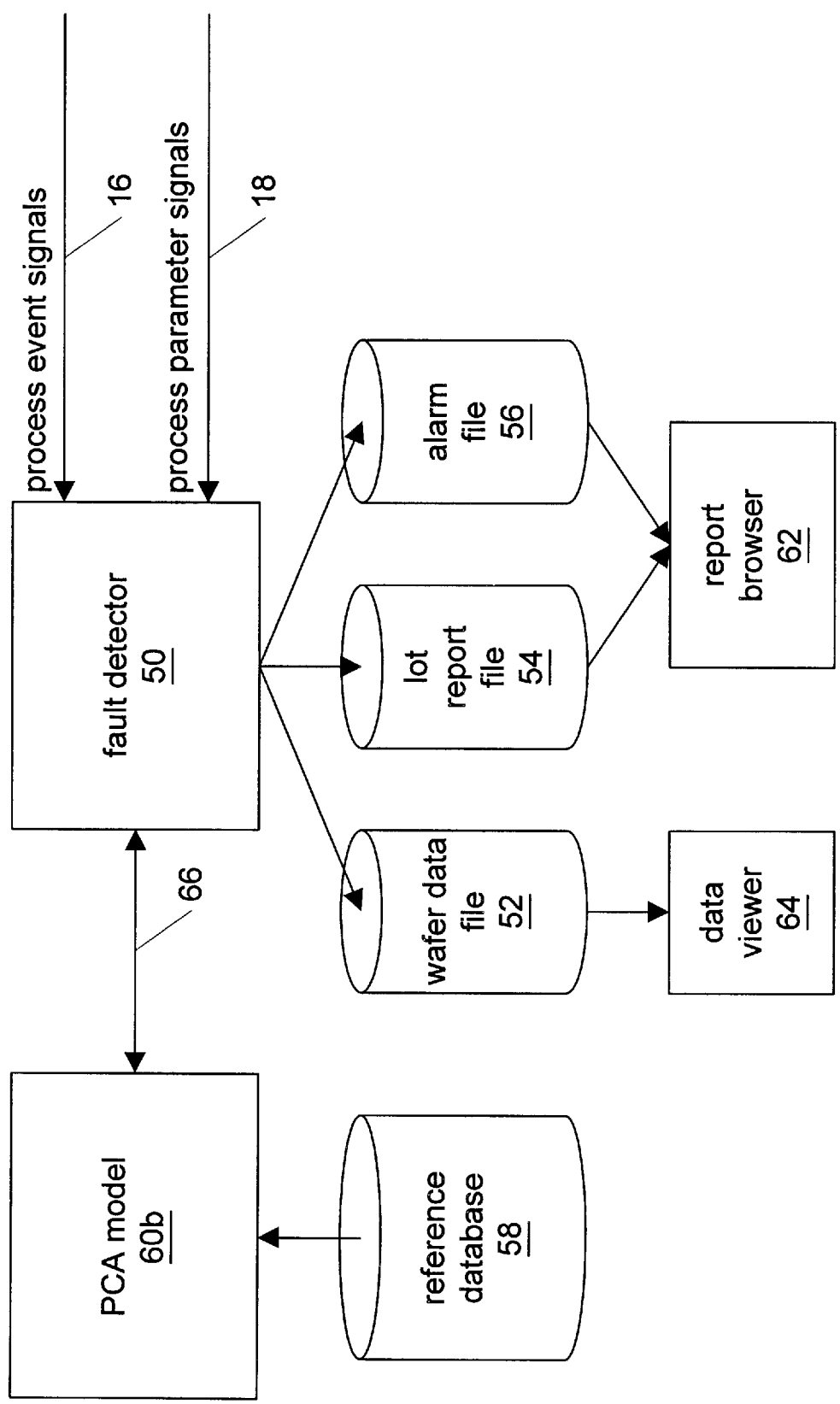
Figure 3C:
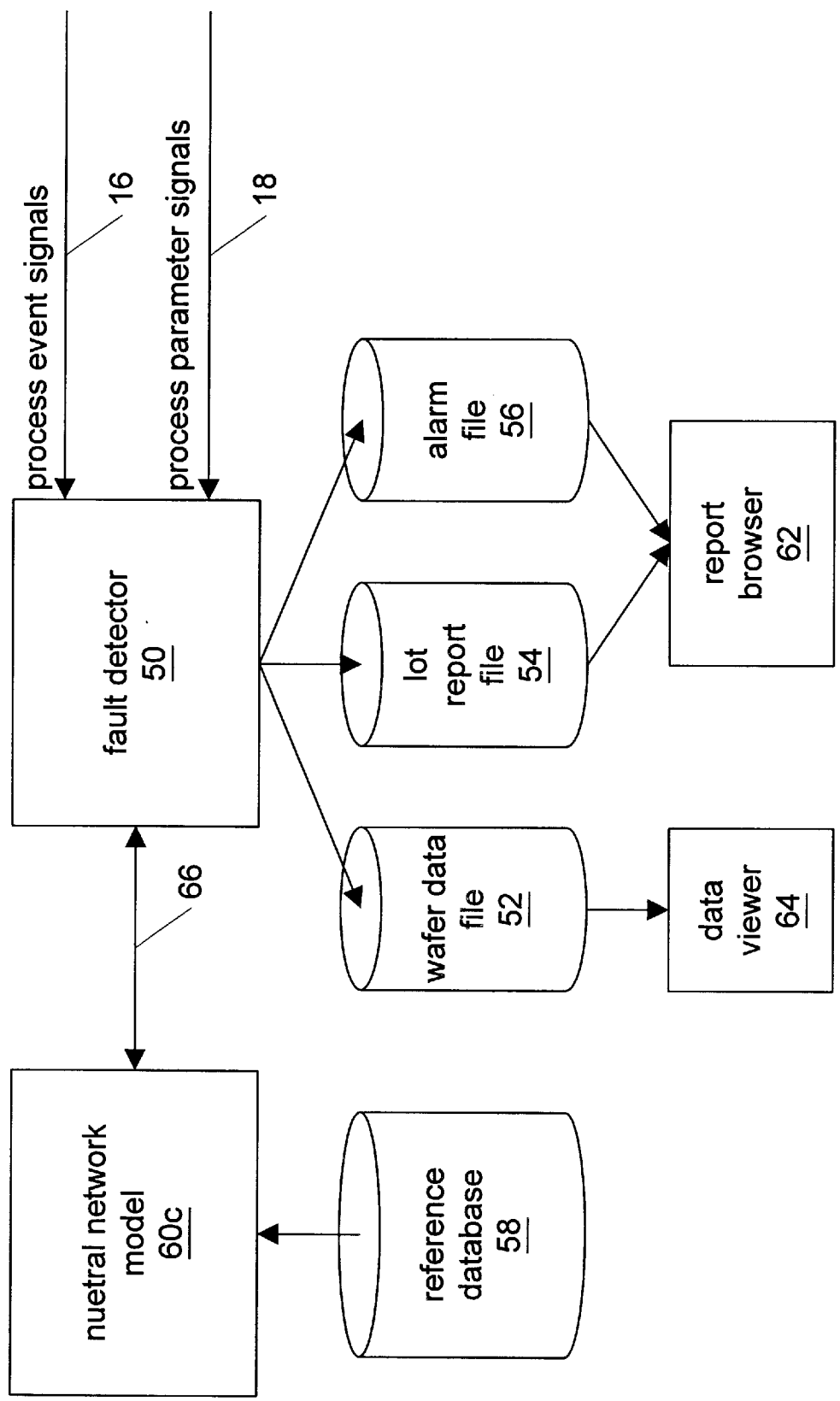

In one embodiment, the model 60 utilizes Universal Process Model (UPM) technology from Triant Technologies® Inc. as shown in FIG. 3a. In another embodiment, the model 60 is a Principle Component Analysis(PCA) model as shown in FIG. 3b. Another embodiment contemplates a neural network model 60 as shown in FIG. 3c. The operation of the model 60 is described infra.

The system employs a data exchange interface 66 for exchanging data between the fault detector 50 and the model 60. In one embodiment the fault detector 50 and model 60 operate in the Microsoft Windows® operating environment and the data exchange interface 66 is the dynamic data exchange (DDE) interface provided in the various Microsoft Windows operating systems. An embodiment is contemplated in which the data exchange interface 66 employs Microsoft OLE Automation. In one embodiment, the LabVIEW environment provides DDE-related virtual instruments for enabling applications, such as the fault detector 50, to exchange data using the DDE interface with other applications.

Thus, the system 10 of the present invention advantageously employs a standard interface between the fault detector 50 and the model 60 such that different models 60 may be incorporated into the system 10 in order to most accurately model the desired wafer fabrication process. The present invention contemplates an embodiment in which a user selects the model 60 from a plurality of models 60 provided by the system 10. Preferably, the user selects a model which is best suited to modeling the particular wafer fabrication process being performed by the process equipment 14.

Figure 4:
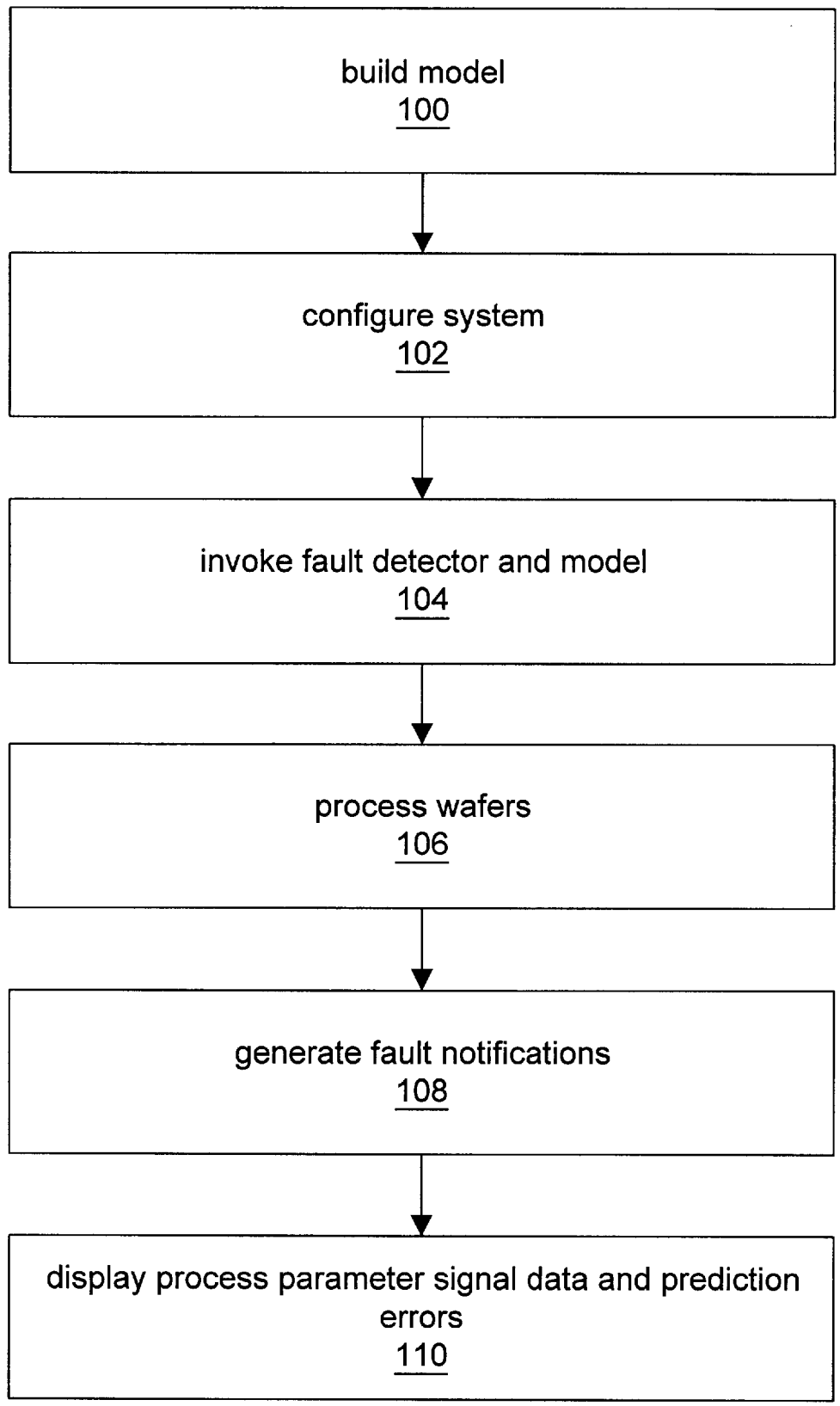
FIG. 4 is a flowchart illustrating steps taken by the system of FIG. 1 to perform fault detection.

Referring now to FIG. 4, a flowchart illustrating steps taken by the system 10 of FIG. 1 to perform fault detection is shown. First, a model 60 (of FIG. 3) is built in step 100. Building the model 60 comprises an engineer or scientist, typically, gathering a reference database 58 (of FIG. 3) of previous process parameter signal 18 (of FIG. 1) data samples and a mathematical algorithm for using the data samples to make a prediction of future data sample values. Tools are commercially available for building the model 60 such as MatLab by MathWorks, Inc. Typically, the model 60 is built "offline", i.e., before attempting to detect faults.

Next, an engineer or operator configures the system 10 in step 102. Configuring the system includes setting attributes of the data acquisition device 20 such as gain values, trigger attributes, clock sampling attributes, input signal modes, input value ranges, and data buffer-related attributes. Configuring the system 10 further includes assigning each of the process parameter signals to a respective channel on the data acquisition device 20. Configuring the system 10 further includes configuring the communications port 22, the process equipment 14 name, data storage and network drives for storing the various files in the system, and the pathname to the model 60 program. Configuring the system 10 further includes configuring the relationships between the various process recipes and the portion of the reference database, i.e., the models, associated with the recipes. The configuration settings are saved in a configuration file for later use by the fault detector 50.

Next, an engineer or process tool operator invokes the fault detector 50 and model 60 in step 104. Preferably, model 60 is also an executable program and the fault detector 50 invokes the model 60. In one embodiment, invoking the fault detector 50 includes invoking the LabVIEW programming environment, and opening and running a "virtual instrument" program which the fault detector 50 comprises. The fault detector virtual instrument program performs a system call to execute the model 60, which is also an executable program. More detail about the operation of the fault detector 50 will be discussed infra.

Next, the wafers are processed by the process equipment 14 in step 106. The fault detector 50, having been invoked in step 104, monitors the process equipment 14 in real-time attempting to detect faults in the process equipment 14 while the wafers are being processed.

If the fault detector 50 detects faults, the fault detector 50 generates fault notifications to the process equipment 14 operator in step 108. Furthermore, in one embodiment, engineers or other users are enabled to receive fault notifications at a terminal remote to the process equipment 14 across a network connection via the network interface card 44 (of FIG. 2).

The process parameter signals 18 data samples acquired by the fault detector 50 and the prediction errors generated by the model 60 are displayed using the data viewer 64 and report browser 62 in step 108. In addition, in one embodiment, the process parameter signals 18 may be viewed in real time as the data is acquired.

Figure 5:
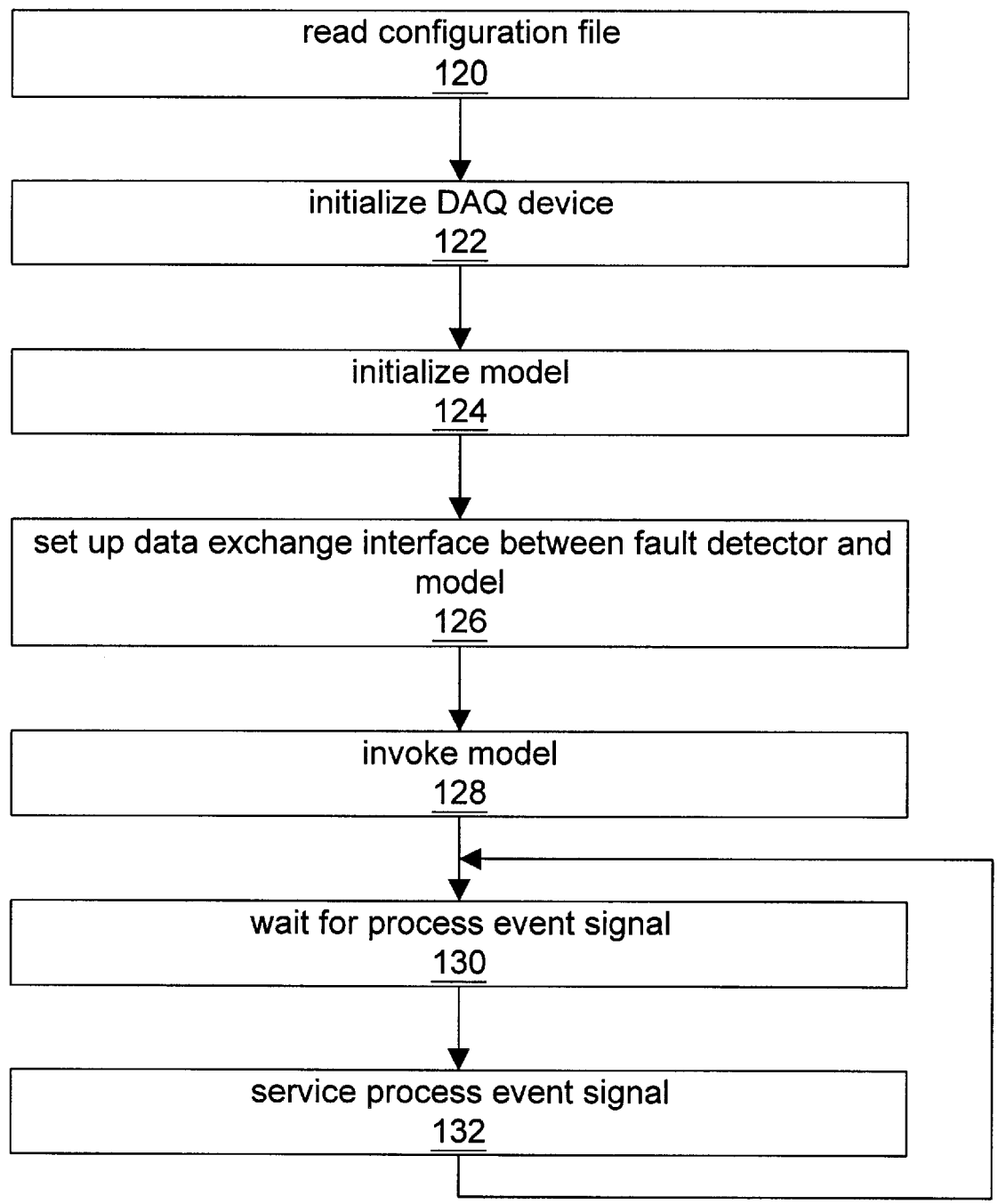
FIG. 5 is a flowchart illustrating the operation of the fault detector and model of FIG. 3.

Referring now to FIG. 5, a flowchart illustrating the operation of the fault detector 50 and model 60 of FIG. 3 is shown. When the fault detector 50 is invoked it reads a configuration file in step 120. The configuration file includes configuration information regarding the configuration of the data acquisition device 20. The configuration file is created in step 102 (of FIG. 4). After reading the configuration file, the fault detector 50 uses the configuration information to initialize the data acquisition device 20 in step 122. Initializing the data acquisition device 20 includes setting the attributes of the data acquisition device 20 as specified in the configuration file.

The fault detector 50 then initializes the model 60 in step 124. Initializing the model 60 includes initializing parameters of the model. In one embodiment, initializing the model 60 includes specifying a sample range size within the reference database 58 (of FIG. 3) to be used in generating a prediction error.

The fault detector 50 then sets up the data exchange interface 66 between the fault detector 50 and the model 60 in step 126 to enable the fault detector 50 and model 60 to exchange information. In particular, the fault detector 50 provides sample information to the model 60 and the model 60 provides prediction error information to the fault detector 50 in response to the sample information. In one embodiment, the data exchange interface 66 includes the Microsoft DDE interface.

Setting up the data exchange interface 66 between the fault detector 50 and the model 60 preferably comprises employing the DDE Srv Register Service.vi virtual instrument provided by LabVIEW to establish a DDE server and employing a plurality of DDE Srv Register Item.vi virtual instruments provided by LabVIEW to define items for the DDE server. The fault detector 50 uses the DDE Srv Set Item.vi virtual instrument provided by LabVIEW to provide sample information to the model 60. The fault detector 50 uses the DDE Srv Check Item.vi virtual instrument provided by LabVIEW to receive prediction error information from the model 60.

Once the initialization steps 120, 122, 124, 126 and 128 have been performed, the fault detector 50 waits for a process event signal 16 (of FIG. 1) from the process equipment 14 indicating the occurrence of a process event in step 130. In one embodiment, an interrupt to the CPU 30 (of FIG. 2) is generated by the communication port 22 or the data acquisition device 20 when a process event occurs. When the fault detector 50 receives notification of a process event, the fault detector 50 services the process event in step 132. A detailed description of the steps performed by the fault detector 50 to service a process event are given with regard to FIG. 6.

Figure 6:
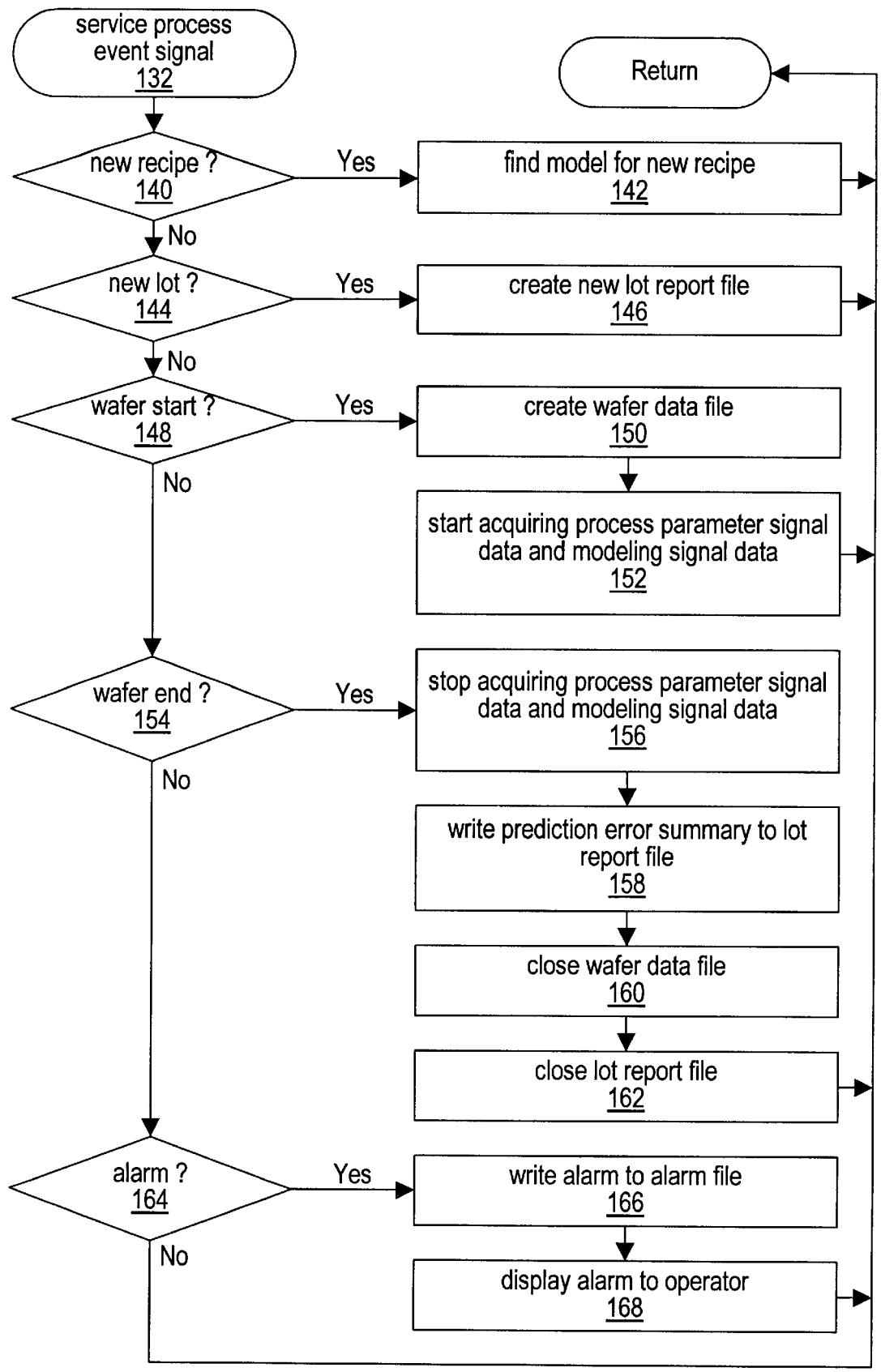
FIG. 6 is a flowchart illustrating more detailed steps taken in performing the step of servicing process event signals of FIG. 5.

Referring now to FIG. 6, a flowchart illustrating more detailed steps taken in performing the step of servicing process event signals 132 of FIG. 5 is shown. When the fault detector 50 receives notification of the occurrence of a process event, the fault detector 50 determines which type of process event has occurred. The set of possible process events is determined by the set of process events which the process equipment 14 is capable of generating. In one embodiment, the SECS-II protocol specification is used to specify encodings for the set of possible process events. In one embodiment, the digital process event signals generated by the process equipment 14 determine the set of possible process events. Preferably, the fault detector 50 is configured to service at least the following events: notification of a new process recipe, starting to process a new lot of wafers, starting to process a new wafer, ending processing a wafer, and an alarm.

In step 140, the fault detector 50 determines if a new recipe event has occurred. In one embodiment, the process equipment 14 generates a new recipe event. In another embodiment, a new recipe is specified by user input. If the fault detector 50 receives a new recipe event, the fault detector 50 finds the appropriate model associated with the new recipe and instructs the model 60 (of FIG. 3) to use the associated model to model forthcoming data sample information in step 142. After servicing the new recipe event, the fault detector 50 returns to waiting for another process event, i.e., step 130 of FIG. 5.

In step 144, the fault detector 50 determines if a new lot event has occurred. In one embodiment, the process equipment 14 generates a new lot event. In another embodiment, a new lot number is specified by user input. If the fault detector 50 receives a new lot event, the fault detector 50 creates a new lot report file in step 146, such as the lot report file 54 (of FIG. 3), for the new lot of wafers. Preferably, creating a new lot report file includes allocating permanent storage space for the new lot report file, preferably on the hard drive 42 (of FIG. 2) and writing header information to the lot report file. Preferably, the header information includes the lot number, a date on which the processing of the lot began, and a recipe number associated with the lot. Preferably, the new lot report file is placed within a directory indicative of the lot number, recipe, and date associated with the lot. After servicing the new lot event, the fault detector 50 returns to waiting for another process event, i.e., step 130 of FIG. 5.

In step 148, the fault detector 50 determines if a wafer start event has occurred. If the fault detector 50 determines that a wafer start event has occurred, the fault detector 50 creates a new wafer data file in step 150, such as the wafer data file 52 (of FIG. 3), for the new wafer. Preferably, creating a new wafer data file includes allocating permanent storage space for the new wafer data file, preferably on the hard drive 42 (of FIG. 2). Preferably, a filename is chosen for the new wafer data file indicative of the boat number and wafer number associated with the wafer. Preferably, the new wafer data file is placed within a directory indicative of the lot number, recipe, and date associated with the wafer.

After creating the new wafer data file, the fault detector 50 controls the data acquisition device 20 to cause the data acquisition device 20 to begin acquiring process parameter signals 18 data samples in step 152. The data acquisition device 20 continues to acquire the data samples and provide the data samples to the fault detector 50 until instructed by the fault detector 50 to stop acquiring data samples. The steps which the fault detector 50 performs in response to receiving data samples from the data acquisition device 20 are described in detail with regard to FIG. 7. After servicing the new lot event, the fault detector 50 returns to waiting for another process event, i.e., step 130 of FIG. 5.

In step 154, the fault detector 50 determines if a wafer end event has occurred. If the fault detector 50 determines that a wafer end event has occurred, the fault detector 50 controls the data acquisition device 20 to cause the data acquisition device 20 to stop acquiring process parameter signals 18 data samples in step 156. The fault detector 50 then, in step 158, writes summary information regarding the prediction errors associated with the processing of the wafer to a lot report file, such as the lot report file which was created in step 146. In one embodiment, the summary information includes a tuple as described in the discussion lot report file of FIG. 3. The fault detector 50 then closes the wafer data file in step 160 and closes the lot report file in step 162. Preferably, closing the files includes performing a system call to request the operating system, such as Windows, to close the file. After servicing the wafer end event, the fault detector 50 returns to waiting for another process event, i.e., step 130 of FIG. 5.

In step 164, the fault detector 50 determines if an alarm has occurred. An alarm is an asynchronous event which the process equipment 14 may generate at any time. If the fault detector 50 determines that an alarm has occurred, the fault detector 50 writes to an alarm file, such as the alarm file 56 of FIG. 3, information indicating the cause of the alarm in step 166 and displays the alarm to the process equipment 14 operator on the video display 40 (of FIG. 2) in step 168. After servicing the alarm, the fault detector 50 returns to waiting for another process event, i.e., step 130 of FIG. 5.

Figure 7:
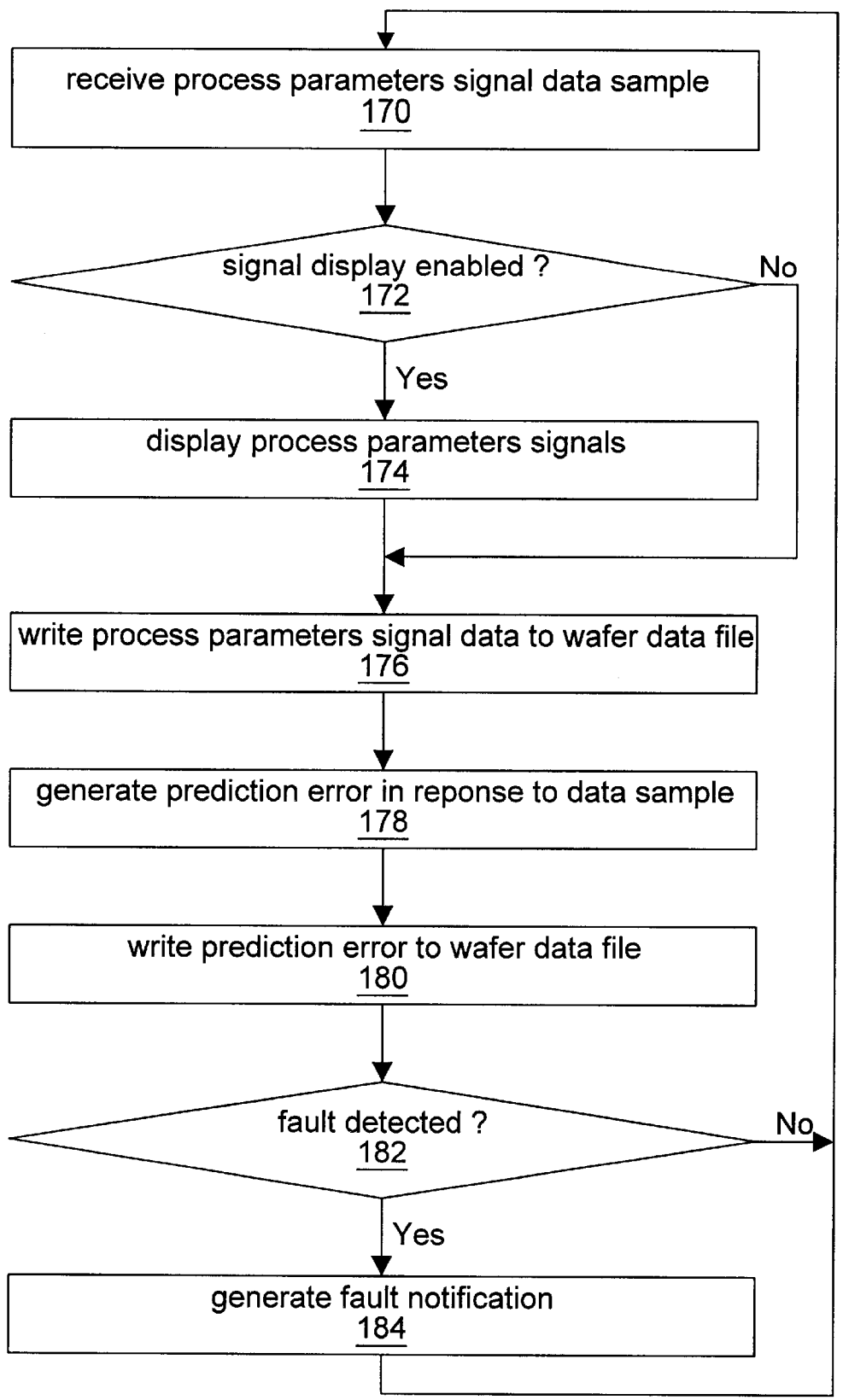
FIG. 7 is a flowchart illustrating steps taken by the fault detector and model of FIG. 3 in response to receiving process parameter signals data samples from the data acquisition device of FIG. 1.

Referring now to FIG. 7, a flowchart illustrating steps taken by the fault detector 50 and model 60 of FIG. 3 in response to receiving process parameter signals 18 data samples from the data acquisition device 20 is shown. The fault detector 50 receives a data sample of the process parameter signals 18 from the data acquisition device 20 in step 170. The fault detector 50 determines if real-time displaying of the process parameter signals 18 is enabled in step 172. Preferably, enabling and disabling of the real-time displaying of the process parameter signals 18 is user selectable. If the real-time displaying of the process parameter signals 18 is enabled, the fault detector 50 displays one or more of the process parameter signals 18 on the video display 40 (of FIG. 2) in step 174. Preferably, the one or more of the process parameter signals 18 which are displayed is user selectable. Preferably, displaying the process parameter signals 18 in real-time includes displaying waveforms of the process parameter signals 18 constructed from the data samples acquired by the data acquisition device 20.

The fault detector 50 writes the process parameter signals 18 data sample to the wafer data file associated with the wafer, such as the wafer data file created in step 150 of FIG. 6, in step 176. Preferably, writing the data sample to the wafer data file includes writing a tuple as described in the discussion of the wafer data file 52 of FIG. 3.

The fault detector 50 provides sample information to the model 60 for analysis. Preferably, the sample information includes the data sample and a sample sequence indicator associated with the sample. In one embodiment the sample sequence indicator includes an ordinal sample number denoting the order of the specified sample in the series of samples acquired by the data acquisition device 20. The model 60 receives the sample information and generates a prediction error value and provides the prediction error value to the fault detector 50, via the data exchange interface 66, in response to the sample information in step 178. More detail will be given infra regarding the generation of the prediction error.

The fault detector 50 receives the prediction error from the model 60 and writes the prediction error to the wafer data file in step 180. Preferably, the fault detector 50 writes the prediction error to the wafer data file as part of the tuple which was written in step 176.

The fault detector 50 determines if a fault has occurred in step 182. Preferably, determining the occurrence of a fault includes comparing the prediction error with a prediction error threshold value. In one embodiment, the prediction error threshold value is specified by the user. In one embodiment, the prediction error is a similarity value between 0 and 1 and comparing the prediction error with the prediction error threshold value includes determining whether the similarity is less than a user-specifiable similarity limit, such as 0.95. If the fault detector 50 determines a fault has occurred, the fault detector 50 generates a fault notification in step 184. Preferably, generating a fault notification includes displaying a message on the display screen 40 (of FIG. 2). In one embodiment, generating a fault notification includes generating an audible signal.

In one embodiment, the model 60 generates the prediction error of step 178 of FIG. 7 according to a time-dependent method employing the UPM model of FIG. 3a. A reference database, such as the reference database 58 of FIG. 3, is created as in step 100 of FIG. 4 which includes a set of data samples taken during a know "good" run. A "good" run is defined as the execution of the process steps of a given recipe which produced the desired process results on a wafer. In one embodiment, only one run is used to produce the reference database. Only a single run is necessary because of the good reproducibility of signals from run to run. The recipe includes multiple process steps which occur in a time sequence. Multiple data samples are taken during each process step of the recipe. The number of samples taken during each process step is a function of the sample rate and the length of time each process step takes to complete. The samples are stored in the reference database sequentially according to the order in which they occurred in time.

A new wafer is processed, as in step 106 of FIG. 4, according to the recipe associated with the good run. The fault detector 50 acquires a current data sample while the new wafer is being processed as in step 170 of FIG. 7. The fault detector 50 knows the sample sequence number, also referred to as the "sampling time step", k, relative to the start of the wafer and provides the current data sample and the sampling time step information to model 60.

During initialization of the model, as in step 124 of FIG. 5, the fault detector 50 specifies to the model a sample range size, or sample window size. In one embodiment, the sample range size is dependent upon the particular processing step. The model determines a range of samples from the reference database around the kth sampling time step specified. FIG. 8 shows a sample range based on a sampling time step k equal to 11 and a sample range size of 13. The model 60 makes a "prediction" of what the current sample should be using samples in the sample range specified. The model 60 generates a prediction error, as in step 178 of FIG. 7, by evaluating a difference between the prediction and the current sample, referred to as the similarity. The similarity is an indication of the "system health", i.e., an indication of the proper operation of the process equipment 14.

In one embodiment, the model 60 generates an individual signal health value for each of the process parameter signals 18. In one embodiment, the model excludes an individual signal in the overall system health similarity calculation if the difference between the prediction and the given signal sample is too large.

Principal Component Analysis (PCA) enables reduction of a data set while retaining most of its variation. The new set of variables are called the principal components derived from linear transformations of the original variables. During the transformations, the linear relationship of variables from a process is modeled. The new variables are statistically uncorrelated to each other and typically a small fraction of the variables, typically the first several variables, contain the majority of the variation in original data set. For more information on PCA models the reader is referred to I. T. Jolliffe, *Principal Component Analysis,* Springer-Verlag, New York, 1986 which is hereby incorporated by reference.

Artificial neural network (ANN) techniques is an information processing technology inspired by studies of the brain and nervous system. It approximates biological systems in their abilities to perform pattern recognition, functional synthesis, constraint satisfaction and signal processing. ANNs exploit the massively parallel local processing and distributed representation properties that are believed to exist in the brain. The primary intent of ANNs is to explore and reproduce human information processing tasks such as learning from examples and making prediction based what has been learned. For more information regarding ANNs the reader is referred to P. K. Simpson, *Artificial Neural Systems: Foundations, Paradigms, Applications, and Implementations,* Pergamon Press, 1990 which is hereby incorporated by reference.

The present invention contemplates embodiments in which a PCA or ANN technique is used to build models representing normal process conditions. The models are employed to detect any deviations of a current process run from normal run.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A system for detecting faults in a process tool, comprising:

means for receiving process event signals generated by the process tool;

a data acquisition device configured to acquire a sample of process parameter signals during operation of the process tool;

a model configured to receive said sample and generate a prediction error in response to said sample; and a fault detector in communication with said model configured to receive said sample from said data acquisition device and said process event signals from said receiving means, provide said sample to said model, receive said prediction error from said model, and use said prediction error to detect a fault in the process tool.

2. The system as recited in claim 1, wherein said system further comprises a display screen configured to display notification of said fault.

3. The system as recited in claim 1, wherein said system further comprises a reference database of representative samples, wherein said model uses said reference database to generate said prediction error in response to said sample.

4. The system as recited in claim 3, wherein model uses only a range of said representative samples to generate said prediction error in response to said sample.

5. The system as recited in claim 4, wherein said fault detector provides sequence information regarding said sample to said model, wherein said model determines said range of said representative samples in response to said sequence information.

6. The system as recited in claim 1, wherein said system further comprises a report browser configured to display said prediction error.

7. The system as recited in claim 1, wherein said system further comprises a data viewer configured to display said sample.

8. The system as recited in claim 1, wherein said receiving means comprises said data acquisition device, wherein said data acquisition device is configured to receive said process event signals.

9. The system as recited in claim 1, wherein said receiving means comprises a communications port configured to receive said process event signals.

10. The system as recited in claim 1, wherein said process event signals comprise at least one event from the group comprising a wafer start, a wafer end, a new lot, a new recipe, and an alarm.

11. The system as recited in claim 1, wherein said fault detector is configured to receive said process event signals and control said data acquisition device to acquire said data sample in response to said process event signals.

12. The system as recited in claim 1, wherein said model is further configured to receive a recipe identifier and generate said prediction error in response to said recipe identifier.

13. The system as recited in claim 12, wherein said recipe identifier is specified via user input.

14. The system as recited in claim 12, wherein said recipe identifier is provided to said fault detector by said process event signals.

15. A system for detecting faults in a process tool, comprising:
    a data acquisition device configured to acquire a sample of process parameter signals during operation of the process tool;
    a model configured to receive said sample and generate a prediction error in response to said sample, wherein said model is one of a plurality of possible models; and
    a fault detector in communication with said model configured to receive said sample from said data acquisition device, provide said sample to said model, receive said prediction error from said model, and use said prediction error to detect a fault in the process tool;
    wherein said fault detector is configured to use said prediction errors to detect a fault independent of which one of said plurality of possible models is used to generate said prediction error.

16. The system as recited in claim 15, wherein said model is a model chosen from the group consisting of a Universal Process Model, a Principle Component Analysis model, and a neural network.

17. The system as recited in claim 15, wherein said system further comprises a display screen configured to display notification of said fault.

18. The system as recited in claim 15, wherein said system further comprises a reference database of representative samples, wherein said model uses said reference database to generate said prediction error in response to said sample.

19. The system as recited in claim 1, wherein said model is further configured to receive a recipe identifier and generate said prediction error in response to said recipe identifier.

20. A system for detecting faults in a process tool, comprising:
    means for receiving process event signals generated by the process tool;
    a data acquisition device configured to acquire a sample of process parameter signals during operation of the process tool;
    a model configured to receive said sample and generate a prediction error in response to said sample, wherein said model is one of a plurality of possible models; and
    a fault detector in communication with said model configured to receive said sample from said data acquisition device and said process event signals from said receiving means, provide said sample to said model, receive said prediction error from said model, and use said prediction error to detect a fault in the process tool;
    wherein said fault detector is configured to use said prediction errors to detect a fault independent of which one of said plurality of possible models is used to generate said prediction error.

21. A method for detecting faults in a process tool, comprising:
    receiving process event signals generated by the process tool;
    acquiring a sample of process parameter signals during operation of the process tool; generating a prediction error in response to said sample; and
    detecting a fault in the process tool using said prediction error.

22. The method as recited in claim 21, wherein said detecting a fault in the process tool using said prediction error comprises comparing said prediction error with a prediction error threshold value.

23. The method as recited in claim 21, further comprising displaying notification of said fault on a display screen after said detecting said fault.

24. The method as recited in claim 21, wherein said generating a prediction error in response to said sample comprises using a reference database of representative samples to generate said prediction error.

25. The method as recited in claim 24, wherein said using a reference database of representative samples to generate said prediction error comprises using only a range of said representative samples to generate said prediction error.

26. The method as recited in claim 25, further comprising receiving sequence information regarding said sample, and determining said range of said representative samples in response to said sequence information.

27. The method as recited in claim 21, further comprising displaying said prediction error.

28. The method as recited in claim 21, further comprising displaying said sample.

29. The method as recited in claim 21, further comprising acquiring said data sample in response to said receiving process event signals generated by the process tool.

30. The method as recited in claim 21, further comprising receiving a recipe identifier, wherein said generating a prediction error in response to said sample is in response to said receiving said recipe identifier.

31. A method for detecting faults in a process tool, comprising:
- selecting a model for generating a prediction error in response to a sample of process parameter signals from a plurality of possible models;
- acquiring said sample during operation of the process tool;
- said model generating a prediction error in response to said sample; and
- detecting a fault in the process tool using said prediction error;
- wherein said detecting a fault in the process tool using said prediction error is performed independent of which one of said plurality of possible models is used to generate said prediction error.

32. The method as recited in claim 31, wherein said selecting a model comprises selecting a model from the group consisting of a Universal Process Model, a Principle Component Analysis model, and a neural network.

33. The method as recited in claim 31, further comprising displaying notification of said fault on a display screen.

34. The method as recited in claim 31, wherein said generating a prediction error in response to said sample comprises using a reference database of representative samples to generate said prediction error.

35. The method as recited in claim 31, further comprising receiving a recipe identifier, wherein said generating a prediction error in response to said sample is in response to said receiving said recipe identifier.

36. A method for detecting faults in a process tool, comprising:
- selecting a model for generating a prediction error in response to a sample of process parameter signals from a plurality of possible models;
- acquiring said sample during operation of the process tool;
- receiving process event signals generated by the process tool;
- said model generating a prediction error in response to said sample; and
- detecting a fault in the process tool using said prediction error;
- wherein said detecting a fault in the process tool using said prediction error is performed independent of which one of said plurality of possible models is used to generate said prediction error.

\* \* \* \* \*